United States Patent
Bhattacharyya

(10) Patent No.: US 6,784,480 B2
(45) Date of Patent: Aug. 31, 2004

(54) ASYMMETRIC BAND-GAP ENGINEERED NONVOLATILE MEMORY DEVICE

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/075,484

(22) Filed: Feb. 12, 2002

(65) Prior Publication Data

US 2003/0151948 A1 Aug. 14, 2003

(51) Int. Cl.[7] ........................ H01L 29/76; H01L 29/788
(52) U.S. Cl. ........................ 257/314; 257/318
(58) Field of Search ................. 257/314, 315, 257/316, 317, 318, 319; 438/158, 261, 591; 365/185.01, 185.18, 185.19, 185.26, 185.33

(56) References Cited

U.S. PATENT DOCUMENTS

| | | | |
|---|---|---|---|
| 3,978,577 A | 9/1976 | Bhattacharyya et al. ...... 29/571 |
| 4,412,902 A | 11/1983 | Michikami et al. ......... 204/192 |
| 4,449,205 A * | 5/1984 | Hoffman ................. 365/185.19 |
| 4,495,219 A * | 1/1985 | Kato et al. ................. 438/591 |
| 4,717,943 A * | 1/1988 | Wolf et al. ................. 257/324 |
| 4,780,424 A | 10/1988 | Holler et al. ................. 437/29 |
| 4,794,565 A * | 12/1988 | Wu et al. ................. 257/316 |
| 4,870,470 A * | 9/1989 | Bass et al. ................. 257/324 |
| 5,350,738 A | 9/1994 | Hase et al. ................. 505/473 |
| 5,445,984 A * | 8/1995 | Hong et al. ................. 438/261 |
| 5,455,792 A * | 10/1995 | Yi ............................. 257/319 |
| 5,510,278 A * | 4/1996 | Nguyen et al. ............. 438/158 |
| 5,617,351 A * | 4/1997 | Bertin et al. ................. 257/319 |
| 5,646,430 A * | 7/1997 | Kaya et al. ................. 257/316 |
| 5,691,230 A | 11/1997 | Forbes ........................ 437/62 |
| 5,801,401 A | 9/1998 | Forbes ........................ 257/77 |
| 5,852,306 A * | 12/1998 | Forbes ........................ 257/316 |
| 5,936,274 A | 8/1999 | Forbes et al. ............... 257/315 |

(List continued on next page.)

OTHER PUBLICATIONS

Arya, S., et al., "Conduction Properties of Thin Al2O3 Films," *Thin Solid Films*, 9/1, (1982), 363–374.

(List continued on next page.)

Primary Examiner—Trong Phan
(74) Attorney, Agent, or Firm—Schwegman, Lundberg, Woessner & Kluth, P.A.

(57) ABSTRACT

Systems and methods are provided for nonvolatile memory devices that incorporate a band-gap engineered gate stack with asymmetric tunnel barriers. One embodiment of a memory device includes first and second source/drain regions separated by a channel region in a substrate, a control gate, and a gate stack between the control gate and the channel region. The gate stack includes a first insulator region in contact with the channel region, a floating charge-storage region in contact with the first insulator region, and a second insulator region in contact with the floating charge-storage region and the control gate. The gate stack includes selected material, in conjunction with control gate metallurgy, for providing desired asymmetric energy barriers that are adapted to primarily restrict carrier flow during programming to a selected carrier between the control gate and the floating charge-storage region, and to retain a programmed charge in the floating charge-storage region. Other aspects are provided herein.

84 Claims, 17 Drawing Sheets

U.S. PATENT DOCUMENTS

| | | | | |
|---|---|---|---|---|
| 5,952,692 | A | | 9/1999 | Nakazato et al. ............ 257/321 |
| 5,981,350 | A | | 11/1999 | Geusic et al. ................ 438/386 |
| 6,025,627 | A | | 2/2000 | Forbes et al. ................ 257/321 |
| 6,031,263 | A | | 2/2000 | Forbes et al. ................ 257/315 |
| 6,101,131 | A | * | 8/2000 | Chang ................... 365/185.33 |
| 6,127,227 | A | * | 10/2000 | Lin et al. ..................... 438/261 |
| 6,134,175 | A | | 10/2000 | Forbes et al. .......... 365/230.06 |
| 6,143,636 | A | | 11/2000 | Forbes et al. ................ 438/587 |
| 6,169,306 | B1 | * | 1/2001 | Gardner et al. ............. 257/314 |
| 6,208,164 | B1 | | 3/2001 | Noble et al. ................... 326/41 |
| 6,288,419 | B1 | * | 9/2001 | Prall et al. ................... 257/315 |
| 2003/0042527 | A1 | | 3/2003 | Forbes et al. ................ 257/315 |
| 2003/0042532 | A1 | | 3/2003 | Forbes ....................... 257/316 |
| 2003/0043622 | A1 | | 3/2003 | Forbes .................. 365/185.05 |
| 2003/0043630 | A1 | | 3/2003 | Forbes et al. .......... 365/185.26 |
| 2003/0043632 | A1 | | 3/2003 | Forbes .................. 365/185.28 |
| 2003/0043633 | A1 | | 3/2003 | Forbes et al. .......... 365/185.28 |
| 2003/0043637 | A1 | | 3/2003 | Forbes et al. .......... 365/185.33 |
| 2003/0045082 | A1 | | 3/2003 | Eldridge et al. ............ 438/593 |
| 2003/0048666 | A1 | | 3/2003 | Eldridge et al. ....... 365/185.28 |
| 2004/0004245 | A1 | | 1/2004 | Forbes et al. ................ 257/315 |
| 2004/0004247 | A1 | | 1/2004 | Forbes et al. ................ 257/324 |
| 2004/0004859 | A1 | | 1/2004 | Forbes et al. .......... 365/185.05 |

OTHER PUBLICATIONS

Bhattacharyya, A., "Physical & Electrical Characteristics of LPCVD Silicon Rich Nitride", *ECS Technical Digest, J. Electrochem. Soc.*, 131(11), 691 RDP, New Orleans,(1984), 469C.

Dipert, Brian, "Flash Memory Goes Mainstream", *IEEE Spectrum*, 30(10), (Oct. 1993), 48–52.

Eldridge, J. M., et al., "Growth of Thin PbO Layers on Lead Films", *Surface Science*, 40, (1973),512–530.

Eldridge, J., et al., "Measurement of Tunnel Current Density in a Metal–Oxide–Metal System as a Function of Oxide Thickness", *Proc.12th Intern. Conf. on Low Temperature Physics*, (1971),427–428.

Grenier, J., "Josephson Tunneling Barriers by rf Sputter Etching in an Oxygen Plasma", *Journal of Applied Physics*, (42)12, (Nov. 1971),5151–5155.

Greiner, J., "Oxidation of lead films by rf sputter etching in an oxygen plasma", *Journal of Applied Physics*, 45(1), (1974),32–37.

Gundlach, K., et al., "Logarithmic Conductivity of Al–Al2O3–Al Tunneling Junctions Produced by Plasma and by Thermal Oxidation", *Surface Science*, 27, (1971), 125–141.

Han, Kwangseok, "Characteristics of P–Channel Si Nano–Crystal Memory", *IEDM Technical Digest, International Electron Devices Meeting*, (Dec. 10–13, 2000), 309–312.

Hurych, Z., "Influence of Non–Uniform Thickness of Dielectric Layers on Capacitance and Tunnel Currents", *Solid–State Electronics vol.9*, (1966),967–979.

Inumiya, S, et al., "Conformable formation of high quality ultra–thin amorphous Ta2 O5 gate dielectrics utilizing water assisted deposition (WAD) for sub 50 nm damascence metal gate MOSFETs", *IEDM Technical Digest. International Electron Devices Meeting*, (Dec. 10–13, 2000),649–652.

Kubaschewski, O., et al., "Oxidation of Metals and Alloys", *Butterworths, London*, (1962),53–63.

Luan, H. F., "High Quality Ta2O5 Gate Dielectrics with Tox, eq<10A", *IEDM Technical Digest, International Electron Devices Meeting*, (Dec. 5–8, 1999),141–143.

Manchanda, L., "Si–Doped aluminates for high temperature metal–gate CMOS: Zr–Al–Si–O, a novel gate dielectric for low power applications", *IEDM Technical Digest. International Electron Devices Meeting*, (Dec. 10–13, 2000),23–26.

Masuoka, F., et al., "A 256K Flash EEPROM using Triple Polysilicon Technology", *IEEE International Solid–State Circuits Conference, Digest of Technical Papers*, (1985), 168–169.

Masuoka, F., et al., "A New Flash EEPROM Cell using Triple Polysilicon Technology", *International Electron Devices Meeting, Technical Digest*, San Francisco, CA, (1984),464–467.

Mori, S., et al., "Reliable CVD Inter–Poly Dielectrics for Advanced E&EEPROM", *Symposium on VLSI Technology, Digest of Technical Papers*, (1985), 16–17.

Pashley, R., et al., "Flash Memories: the best of two worlds", *IEEE Spectrum*, 26(12), (Dec. 1989),30–33.

Pollack, S., et al., "Tunneling Through Gaseous Oxidized Films of Al2O3", *Transactions of the Metallurgical Society of AIME*, 233, (1965),497–501.

Robertson, J., et al., "Schottky Barrier height of Tantalum oxide, barium strontium titanate, lead titanate, and strontium bismuth tantalate", *Applied Physics Letters*, vol. 74, No. 8, (Feb. 22, 1999), 1168–1170.

Shi, Ying, "Tunneling Leakage Current in Ultrathin (<4 nm) Nitride/Oxide Stack Dielectrics", *IEEE Electron Device Letters*, 19(10), (Oct. 1998),388–390.

Simmons, J., "Generalized Formula for the Electric Tunnel Effect between Similiar Electrodes Separated by a Thin Insulating Film", *Journal of Applied Physics*, 34(6), (1963), 1793–1803.

Sze, S., "Physics of Semiconductor Devices, Second Edition", *John Wiley & Sons, New York*, (1981),553–556.

Yamaguchi, Takeshi, "Band Diagram and Carrier Conduction Mechanism in ZrO2/Zr–silicate/Si MIS Structure Fabricated by Pulsed–laser–ablation Deposition", *Electron Device Meeting, 2000. IEDM Technical Digest. International*, (2000), 19–22.

* cited by examiner

ASYMMETRIC BAND-GAP ENGINEERED NONVOLATILE MEMORY DEVICE

CROSS REFERENCE TO RELATED APPLICATIONS

This application is related to the following co-pending, commonly assigned U.S. patent applications which are herein incorporated by reference in their entirety: "Flash Memory With Low Tunnel Barrier Interpoly Insulators," Ser. No. 09/945,507, filed on Aug. 30, 2001; "Programmable Array Logic Or Memory Devices With Asymmetrical Tunnel Barriers," Ser. No. 09/943,134, filed on Aug. 30, 2001; and "Scalable Flash/NV Structures and Devices With Extended Endurance," Ser. No. 09/944,985, filed on Aug. 30, 2001.

TECHNICAL FIELD OF THE INVENTION

This invention relates generally to integrated circuits and, more particularly, to nonvolatile programmable memory cells.

BACKGROUND OF THE INVENTION

Conventional nonvolatile flash and Electronically Erasable Programmable Read Only Memory (EEPROM) devices are "dual-threshold" Field Effect Transistor (FET) devices. These devices include a floating silicon gate ("floating gate") isolated from the top programming gate ("control gate"). These devices are programmed (write and/or erase) by applying a set of programming potentials between the control gate and the silicon substrate. Devices are read as being either in the nonconducting state or in the conducting state based on the threshold state of the FET device. Hot carriers, which are usually electrons, are conventionally supplied and injected from the silicon substrate. Electrons are collected by the floating gate to raise the threshold to the nonconducting state for an NFET device and conversely discharged into the substrate to lower the threshold and return to the conducting state. While the reading of the states is similar to the reading of Dynamic Random Access Memory (DRAM) devices, the writing or erasing process typically takes tens or hundreds of milliseconds. Therefore, it is desirable to improve the erase and/or write speed to enhance the range of applications for nonvolatile devices.

The conventional nonvolatile devices discussed above involve high energy ("hot") charge transport between the substrate and the floating gate. Part of the energy of the hot carriers is transferred to the interface lattice between the silicon substrate and the gate oxide. As a result, interface bonds break and interface characteristics get degraded after multiple write-erase cycles. The term "endurance" relates to these effects that multiple write-erase cycles have on the device. Consequently, the hot charge transport generates surface states at the silicon-oxide interface and creates local weak spots in the gate oxide that negatively affects the device by degrading the FET transconductance (Gm), enhancing the stored charge loss from the floating gate (i.e. retention loss), and reducing the endurance (i.e. operable write-erase cycles) of the device.

It has been proposed to preserve the integrity of the silicon-oxide interface by providing primary charge carrier transport between the floating gate and the control gate. For example, it has been proposed to appropriately design the gate stack such that the charge transport takes place preferentially and primarily between the control gate and the floating gate by field emissions of carriers from either or both the control gate and the floating gate during write and erase operations. The nonvolatile devices include a control gate/floating gate capacitor and a floating gate/substrate capacitor. A programming voltage is capacitively divided between these two capacitors. Therefore, in order to provide the primary charge carrier transport between the floating gate and the control gate, the gate stack is designed so that more of the potential, and thus more of the electric field, is imposed between the control gate and the floating gate rather than between the floating gate and the substrate. Such a device enters a low threshold state by hole transport from the control gate and subsequent collection at the floating gate, or by electron transport from the floating gate through the dielectric layer and discharge to the control gate, or by a combination of both the hole transport and the electron transport as stated above. Conversely, such a device enters a high threshold state by hole transport from the floating gate and subsequent discharge to the control gate, or by electron transport from the control gate through the dielectric layer and collection into the floating gate, or by a combination of both the hole transport and the electron transport as stated above. It is noted that the mechanism for charge transport for such devices is based on field emission alone. Conventional devices operate by multiple mechanisms for charge transport which include hot electron emission from the device channel as well as electron field emission from the substrate for a write operation; whereas for an erase operation, the mechanisms may include avalanche hole emission from the device junction and/or electron field emission from the control gate.

Carrier field emission (or tunneling) is exponentially dependent on the field in the insulator and the potential barrier height for emission into the insulator, as provided by the following equation:

$$\frac{J}{E^2} \propto e^{-\frac{(\Phi_B)^{\frac{3}{2}}}{E}}.$$

For the above equation, J represents current density, E represents the electric field, and $\Phi_B$ represents the barrier height or energy barrier. The carrier transport is capable of being significantly enhanced by increasing the electric field (E) imposed across the insulator and is capable of being significantly reduced by obtaining a larger energy barrier height ($\Phi_B$) between materials.

Conventional nonvolatile devices may be termed "substrate-sourced-carrier devices" (SSCD) and the non-conventional nonvolatile devices discussed above may be termed "gate-sourced-carrier device" (GSCD). Since the floating gate acts as a capacitive voltage divider, the potential imposed between the control gate and the substrate is divided between the control gate/floating gate capacitor and the floating gate/substrate capacitor. SSCD devices are designed to have higher coupling constant (K>0.5) to achieve a higher potential drop between the floating gate and the substrate to facilitate charge injection from the substrate during a write or erase operation. GSCDs are designed to have lower coupling constants (K<0.5) for a greater potential drop between the control gate and the floating gate for such operation. With the smaller coupling constant, GSCDs are able to have a smaller geometry and are able to provide higher cell and chip density than conventional SSCDs. However, disadvantages with GSCDs include data retention and read disturb problems as explained below.

With respect to the data retention problem, the GSCD is designed to facilitate charge transport between the control gate and the floating gate. The built-in field between the floating gate and the control gate is higher when the charge (electrons or holes) is stored in the floating gate. If the barrier height for carrier emission is sufficiently low, charge is transported more easily between the floating gate and the control gate, resulting in an enhanced stored charge loss, poorer data retention and loss of non-volatility.

With respect to read disturb problems, all bits from the same word line column are subjected to the read-potential between the control gate and the substrate whenever a specific bit is read. The read-potential is positive at the control gate for NFETs. The addition of the read potential to the built-in potential enhances the stored charge loss (electrons to the control gate and holes to the substrate) during the read-pulse period for all those other bits on the word line holding charge in their floating gates. Sufficient charge is capable of being lost due to these read pulses over time to cause permanent loss of data unless the data is periodically refreshed.

The data retention problem and read disturb problem have prevented applications of GSCD in the past. These problems are capable of being designed out of the conventional SSCD by applying an oxide insulator at the floating gate—substrate interface with a high barrier height of 3.2 ev, by applying a thicker oxide-nitride-oxide (ONO) layer on the top and side of the floating gate such that the equivalent oxide thickness ($t_{ox.eq.}$) between the control gate and the floating gate is greater than 70 nm, and by selecting the cell geometry (by enlarging the cell size) to achieve a larger coupling ratio (K>0.5). For GSCD devices, such approaches with K<0.5 require higher write/erase voltages and result in slower write/erase speeds. Any attempt to improve speed by reducing the insulator thickness between the control gate and the floating gate or lowering the barrier height of the insulator between the control gate and the floating gate enhances the data retention and read disturb problems such that a frequent refresh is needed to prevent data loss.

Therefore, there is a need in the art to provide an improved GSCD with improved voltage scalability, density and endurance while maintaining the smaller geometry and the resulting higher cell and chip density associated with GSCD.

SUMMARY OF THE INVENTION

The above mentioned problems are addressed by the present subject matter and will be understood by reading and studying the following specification. The present subject matter provides nonvolatile memory devices that incorporate a band-gap engineered gate stack with asymmetric tunnel barriers. The gate stack is designed with appropriate energy barriers such that the memory device is capable of being programmed (i.e. written and erased) primarily through charge transport between the control gate and the floating charge-storage medium (i.e. floating gate or floating plate). The gate stack is further designed with appropriate energy barriers to retain the stored charge. The gate stack is further designed with appropriate stack geometry to further limit carrier flow from and to the substrate by providing the appropriate capacitive coupling (k<0.5).

The gate stack materials are selected with the appropriate energy barrier between the silicon substrate, the floating gate/plate, the control gate, and the respective interface insulators such that field emission is selective to either electrons or holes. While the selected carrier transport is enhanced between the control gate to the floating gate/plate due to the reduced barrier height at the control gate-insulator interface during programming, charges are retained in the floating gate/plate due to relatively higher barrier energy at the floating gate-insulator interface caused by the band-gap asymmetry. The insulator at the silicon substrate interface is selected so as to provide large barrier heights for both electrons and holes for minimal emission of carriers from the silicon substrate during write or erase. Additionally, the insulator thickness and stack geometry is designed to provide capacitive coupling K<0.5 to further limit carrier flow from and to the silicon substrate. In this manner, carrier flow is restricted primarily between the control gate and the floating gate/plate in either direction for both write and erase.

One aspect of the present subject matter is a nonvolatile memory device. One embodiment of the memory device includes first and second source/drain regions separated by a channel region in a substrate, a control gate, and a gate stack between the control gate and the channel region. The gate stack includes a first insulator region in contact with the channel region, a floating charge-storage region in contact with the first insulator region, and a second insulator region in contact with the floating charge-storage region and the control gate. The gate stack includes selected material for providing desired asymmetric energy barriers that are adapted to primarily restrict carrier flow during programming to a selected carrier between the control gate and the floating charge-storage region, and to retain a programmed charge in the floating charge-storage region.

One embodiment of the memory device includes a p–substrate. A first n type source/drain region and a second n type source/drain region are separated by a channel region in the substrate. A Silicon Dioxide ($SiO_2$) layer is in contact with the channel region, and a Tantalum Oxide ($Ta_2O_5$) layer is in contact with the $SiO_2$ layer. A charge-storage region is in contact with the $Ta_2O_5$ layer, and a Zirconium Oxide ($ZrO_2$) layer is in contact with the charge-storage layer. An aluminum control gate is in contact with the $ZrO_2$ layer. According to one embodiment, the charge-storage region includes a silicon floating gate. According to another embodiment, the charge-storage region includes a floating plate containing silicon nano crystals to facilitate field emission and charge storage.

These and other aspects, embodiments, advantages, and features will become apparent from the following description of the invention and the referenced drawings.

DETAILED DESCRIPTION OF THE INVENTION

Figure 1:
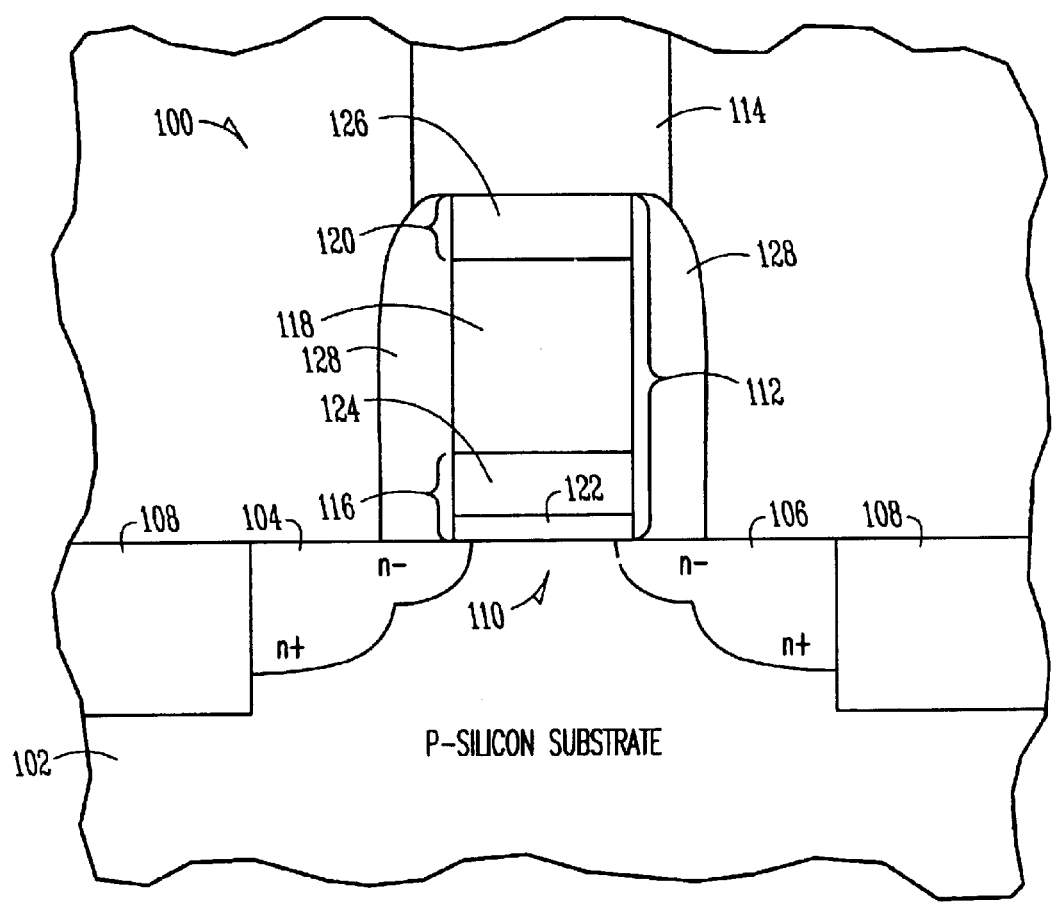
FIG. 1 illustrates one embodiment of a floating gate embodiment of the nonvolatile device of the present invention.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in sidewall), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The present subject matter provides nonvolatile memory devices that incorporate a band-gap engineered gate stack with asymmetric tunnel barriers. The gate stack is designed with appropriate energy barriers, in conjunction with a predetermined control gate metallurgy, such that the memory device is capable of being programmed primarily through charge transport between the control gate and the floating charge-storage medium (i.e. floating gate or floating plate) using field emissions that are selective either to electrons or holes. The gate stack is further designed with appropriate energy barriers to retain the stored charge. The gate stack is further designed with appropriate stack geometry to further limit carrier flow from and to the substrate by providing the appropriate capacitive coupling (k<0.5). The gate stack is further designed with material selected and combined to significantly enhance field emission at a reduced field.

FIG. 1 illustrates one embodiment of a floating gate embodiment of the nonvolatile device of the present invention. The device 100 is formed on a substrate 102. In one embodiment, the substrate 102 includes p–silicon. A first source/drain region 104 and a second source/drain region 106 are formed in the substrate 102 between isolation regions 108. The source/drain regions 104 and 106 are separated by a channel region 110 of the substrate 102. In one embodiment, each of the source/drain regions 104 and 106 include n–silicon positioned to define the channel region 110 in the substrate 102, and n+silicon used to provide a drain contact and a source contact.

An asymmetric gate stack 112 is formed over the channel region 110 of the substrate 102. The gate stack 112 separates a control gate 114 from the substrate 102. According to one embodiment, the control gate 114 includes aluminum, and is connected to an aluminum word line. One embodiment of the asymmetric gate stack 112 includes a first set of insulator region 116, a conventional silicon floating gate 118 that functions as a floating charge-storage region, and a second insulator region 120. The gate stack 112 is engineered to provide the desired asymmetric barrier energies for charge transport between the three nodes (substrate, floating charge-storage region, and control gate) of the device, and is further engineered to provide the desired electric fields between the three nodes of the device.

In one embodiment of the asymmetric gate stack, the first insulator region 116 includes a layer of Silicon Dioxide ($SiO_2$) 122 disposed over the channel region, and a layer of Tantalum Oxide ($Ta_2O_5$) 124 disposed over the layer of $SiO_2$ 122. One embodiment of the layer of $SiO_2$ 122 includes approximately 2 nm of $NH_3$-treated $SiO_2$. Another embodiment of the layer of $SiO_2$ 122 includes approximately 2 nm of NO-treated $SiO_2$. In one embodiment, the layer of $Ta_2O_5$ 124 has an equivalent oxide thickness ($t_{ox.eq.}$) of approximately 3 to 5 nm. In one embodiment, the layer of $Ta_2O_5$ has an equivalent oxide thickness ($t_{ox.eq.}$) of approximately 4 nm. The silicon floating gate 118 is disposed on the layer of $Ta_2O_5$ 124. Conventional silicon floating gates may be approximately 1,000 to 2,000 Å (100 to 200 nm) thick. The invention is not so limited, however, to any particular dimension of the silicon floating gate. A layer of Zirconium Oxide ($ZrO_2$) 126 is disposed on the silicon floating gate. In one embodiment, the layer of $ZrO_2$ 126 has an equivalent oxide thickness ($t_{ox.eq.}$) of approximately 3–5 nm. An Oxide- Nitride-Oxide (ONO) sidewall 128 surrounds the asymmetric gate stack and isolates the device from other integrated circuit devices.

It is noted that the nonvolatile device is capable of being viewed as three nodes that define two capacitors. The three nodes include the control gate, the floating gate, and the substrate. The two capacitors include the control gate/floating gate capacitor and the floating gate/substrate capacitor. Programming potentials are capable of being applied to the control gate and the substrate to produce desired electric fields, i.e. desired electromotive force (EMF), to allow for the desired transport of charge (holes and/or electrons) between the various nodes of the device. Further, it is noted that charge (holes or electrons) is capable of being accumulated and stored on the floating gate. The charge on the floating gate provides a built-in potential that either raises or lowers the threshold voltage of the device. In an NFET device, for example, accumulated holes reduce the threshold voltage of the device so that the device is in a conducting state, and accumulated electrons increase the threshold voltage of the device so that the device is in a nonconducting state.

Figure 2:
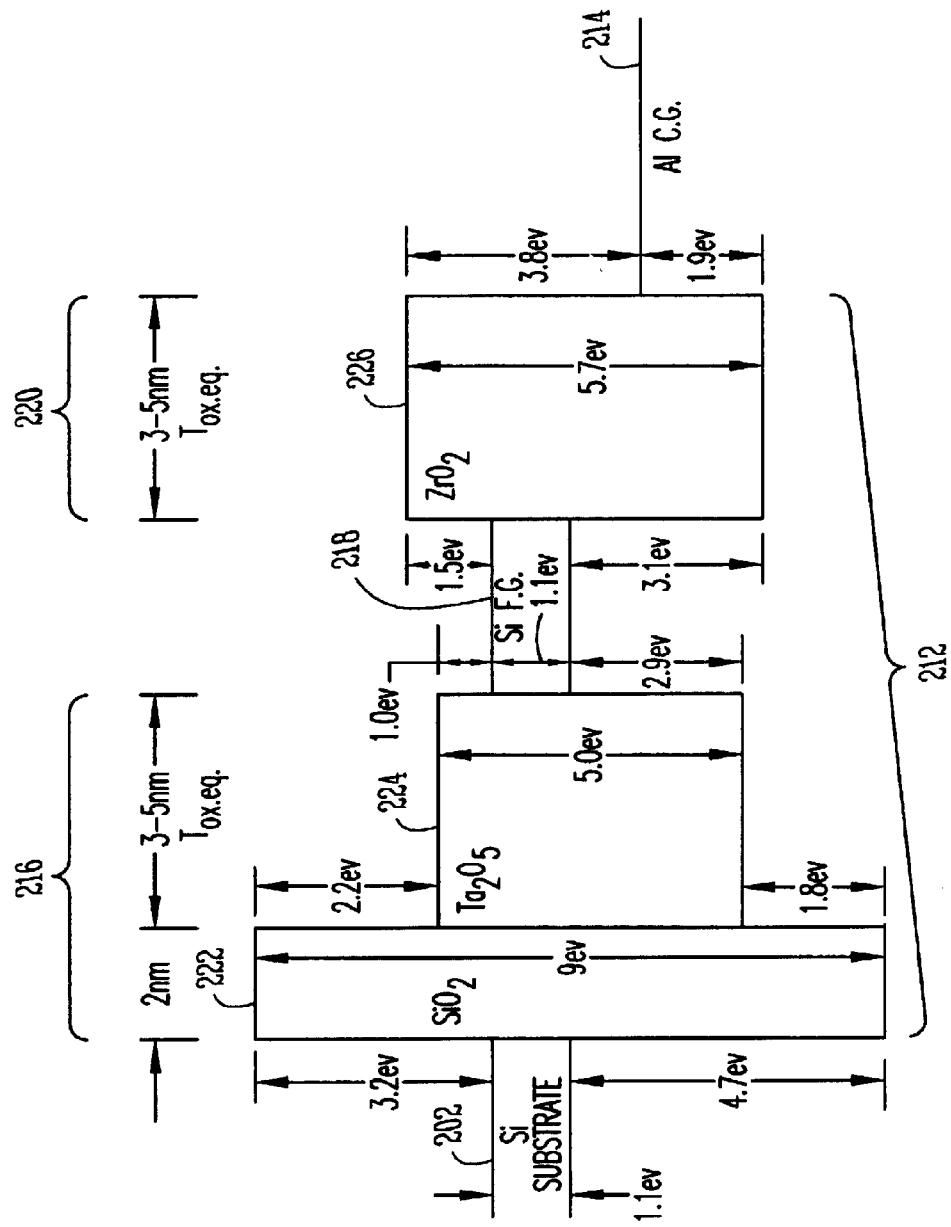
FIG. 2 is a band diagram illustrating an asymmetric band-gap gate stack incorporated in the device of FIG. 1.

FIG. 2 is a band diagram illustrating one embodiment of an asymmetric band-gap gate stack incorporated in the device of FIG. 1. The band diagram is useful for illustrating the charge transport and charge storage during device operation. The band diagram includes representations for the silicon substrate 202, the aluminum control gate 214, and the asymmetric gate stack 212 between the substrate and the control gate. One embodiment of the asymmetric gate stack 212 includes a first insulator region 216 that includes ~2 nm of $SiO_2$ 222 and ~3–5 nm $t_{ox.eq.}$ of $Ta_2O_5$ 224, a silicon floating gate 218, and a second insulator region 220 that includes ~3–5 nm of $ZrO_2$ 226.

The band diagram of FIG. 2 shows various energy barriers between the materials. From the viewpoint of the silicon substrate 202, for example, electrons encounter a 3.2 ev energy barrier and holes encounter a 4.7 ev energy barrier attributable to the $SiO_2$ 222 when they are transported from the silicon substrate 202 to the silicon floating gate 218. From the viewpoint of the control gate 214, electrons encounter a 3.8 ev energy barrier and holes encounter a 1.9 ev energy barrier attributable to the $ZrO_2$ 226 when they are transported from the aluminum control gate 214 to the silicon floating gate 218. From the view point of the floating gate 218, electrons encounter a 1.5 ev energy barrier and holes encounter a 3.1 ev energy barrier attributable to the $ZrO_2$ 226 when they are transported from the floating gate 218 to the control gate 214. Additionally, electrons encounter a 1.0 ev energy barrier and holes encounter a 2.9 ev energy barrier attributable to the $Ta_2O_5$ 224 as well as electrons encountering an additional 2.2 ev energy barrier and hole encountering an additional 1.8 ev attributable to the $SiO_2$ when they are transported from the floating gate toward the substrate. It is noted that electrons exhibit finite probability of directly tunneling from the $Ta_2O_5$ 224 through the $SiO_2$ 222 to the substrate 202. However, due to lower mobility, holes exhibit reduced probability to directly tunnel from the $Ta_2O_5$ 224 through the $SiO_2$ 222 to the substrate 202 compared to the electrons. In any event, the $SiO_2$ 222 provides an additional barrier to charge transport off of the floating gate 218 toward the substrate 202.

Figure 3:
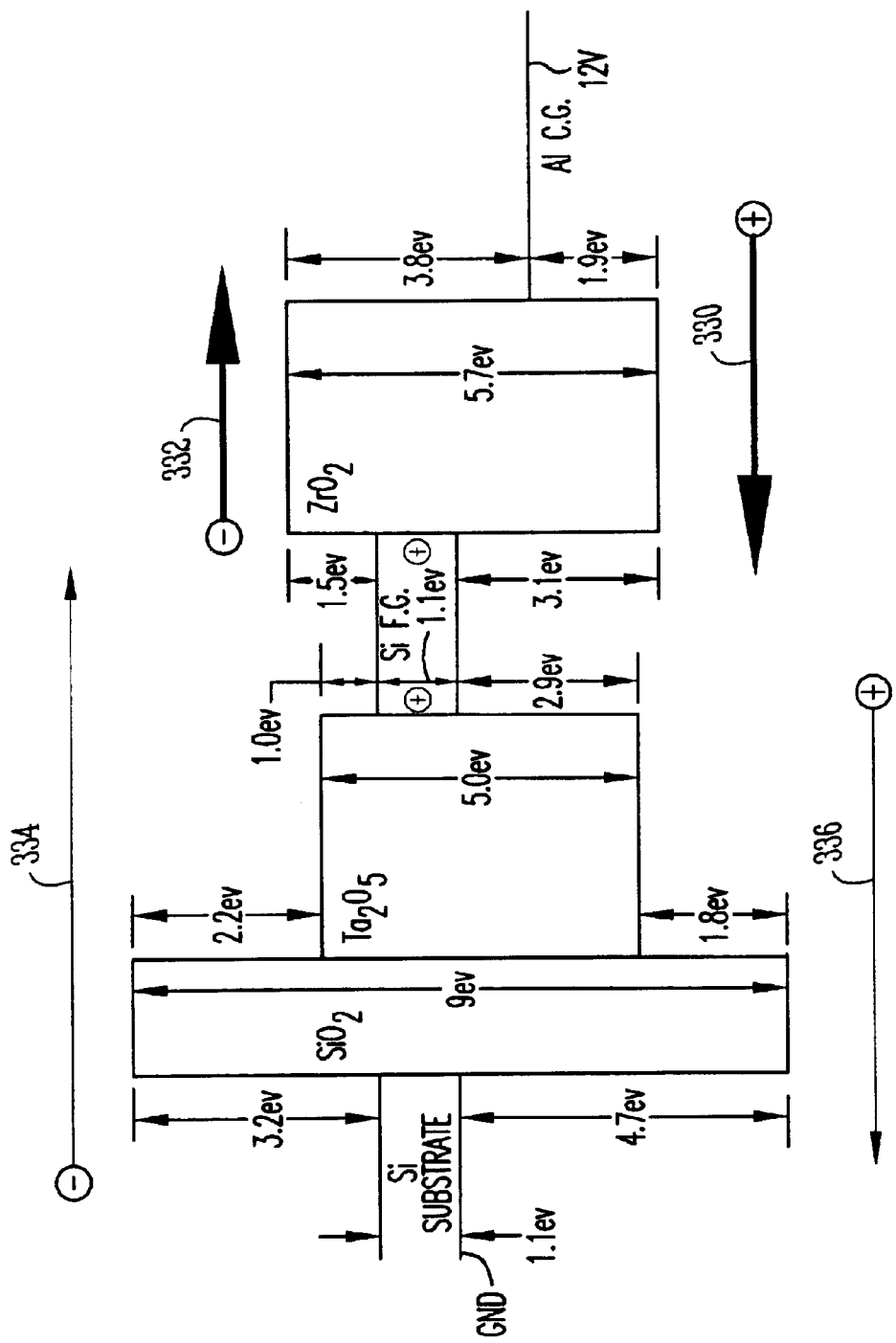
FIG. 3 illustrates charge transport for an Erase Process, defined as a transition from a nonconducting high threshold (1) to a conducting low threshold (0), using the band diagram of FIG. 2.
Figure 4:
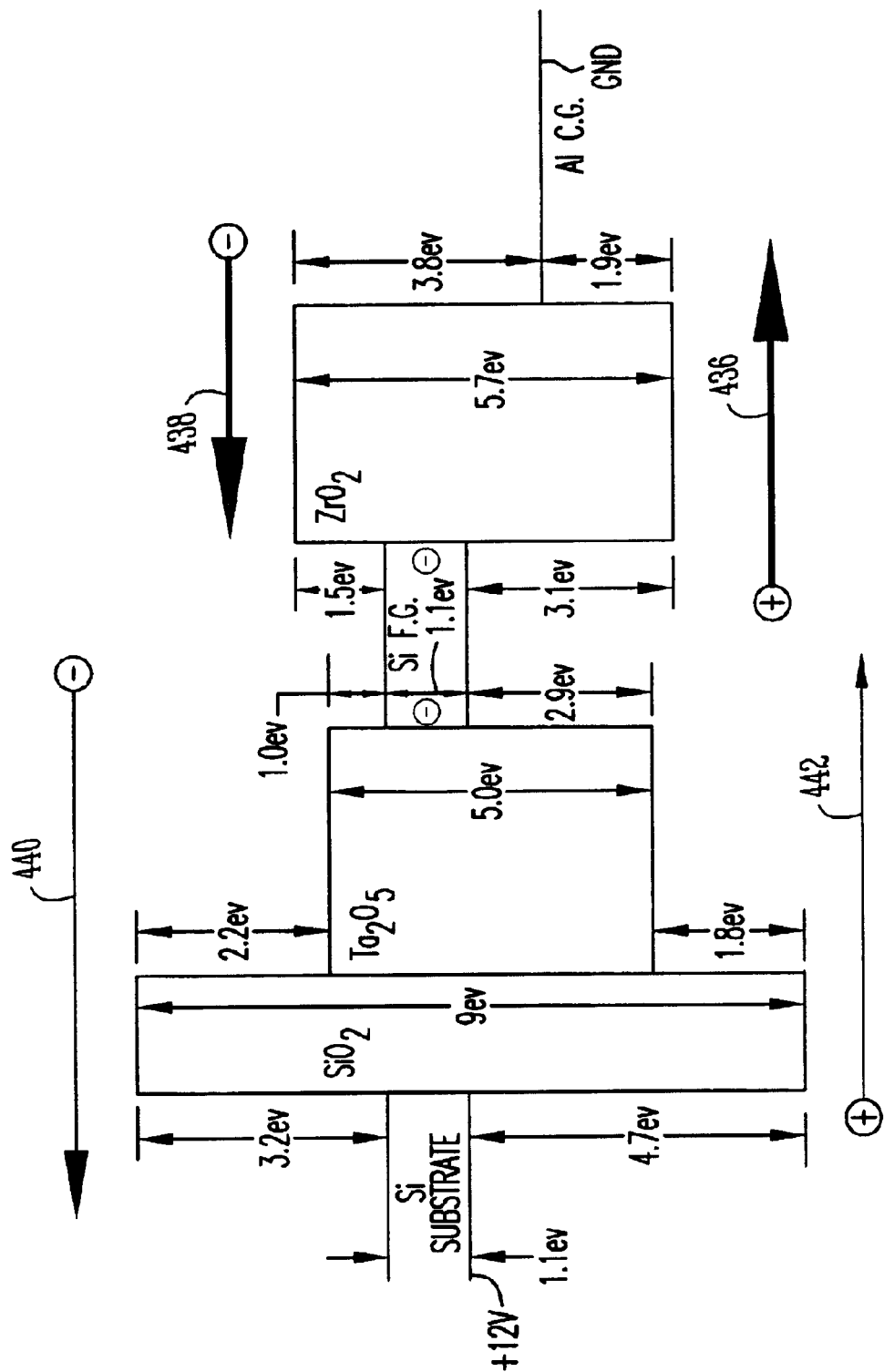
FIG. 4 illustrates charge transport for a Write Process defined as a transition from a conducting low threshold (0) to a nonconducting high threshold (1), using the band diagram of FIG. 2.

Programming voltages are capable of being applied to the silicon substrate 202 and the control gate 214 to provide sufficient field strength for achieving the desired charge transport. FIGS. 3 and 4 illustrate the charge transport that occurs when these programming voltages are applied. For simplicity, field induced band bending has not been shown. One should be mindful of the following points when viewing these diagrams. The floating gate 218 is capable of storing charge so as to provide a built-in potential between the floating gate 218 and the substrate 202 and between the floating gate 218 and the control gate 214. This built-in potential is capable of affecting the charge transport during voltage transients that occur when the programming voltage is first applied or switched. Further, positive and negative programming voltages have a large magnitude. In an NFET device which has a p–substrate, negative programming voltages are applied to the substrate 202 so that the PN junctions of the device are reversed biased (within the tolerance of the junction), and positive programming voltages are applied to the control gate 214. Also, it is possible to engineer the asymmetric gate stack geometry (for example capacitive area), and in particular to vary the equivalent oxide thicknesses of the first insulator region and the second insulator region, to modify the capacitive divider effects between the control gate/floating gate capacitor and the floating gate/substrate capacitor. As such, the gate stack 212 is capable of being engineered to apply the majority of the EMF that is associated with the applied programming voltage across the second insulator region disposed between the control gate 214 and the floating gate 218 rather than across the first insulator region disposed between the floating gate 218 and the substrate 202. Higher EMFs provide higher energy to the charges so as to promote charge emission and transport.

Figure 5:
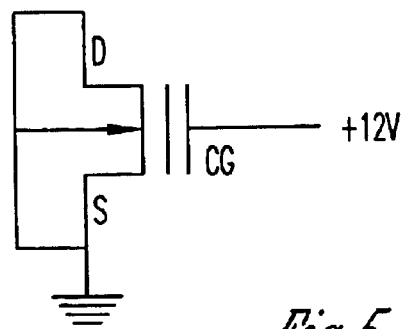
FIG. 5 illustrates operating conditions for erasing an NFET nonvolatile device of FIG. 1.

FIG. 3 illustrates charge transport for an Erase Process, defined as a transition from a nonconducting high threshold (1) to a conducting low threshold (0), using the band diagram of FIG. 2. Thicker arrows represent primary charge transport. During the erase process, a +12V programming voltage is applied to the control gate, and the substrate is grounded to 0 V as shown in FIG. 5. The primary charge transport involves the emission and transport of holes, designated as 330, from the aluminum control gate through the $ZrO_2$ and to the silicon floating gate because of the low 1.9 ev hole barrier height from the aluminum control gate to the $ZrO_2$ of the second insulator region and because of the comparatively higher EMF across the floating gate/control gate capacitor as compared to the silicon substrate/floating gate capacitor part of the gate stack. These holes 330 tunnel through the $ZrO_2$ and are collected at the floating gate. Holes are not likely to be injected and transported from the silicon floating gate because of the high hole energy barriers associated with the charge transport from the silicon floating gate through the $Ta_2O_5$ and the $SiO_2$ to the silicon substrate. The collection of holes at the floating gate lowers the threshold voltage of the NFET device and programs the device to a conducting or "0" state. That is, the NFET device is erased. At the same time, a complimentary charge transport occurs as electrons, designated as 332, are emitted and transported from the silicon floating gate through the $ZrO_2$ to the aluminum control gate because of the low 1.5 ev electron barrier height from the silicon floating gate to the $ZrO_2$ and because of the comparatively higher EMF across the floating gate/control gate capacitor as stated above. Together, hole trapping and electron detrapping at the floating gate enhance the erase process.

Two additional charge emission and transport processes are also identified in FIG. 3. Electron emission and transport from the silicon substrate is identified as 334 while hole emission and transport from the floating gate is identified as 336. However, such mechanisms are dramatically suppressed due to large barrier energies (3.2 ev for electrons and 4.7 ev (2.9 ev+1.8 ev) for holes), and reduced programming field (E) between silicon substrate and the floating gate (k<0.5 by design) as discussed with the carrier field emission equation previously provided in the section entitled Background of the Invention. These smaller charge transports 334 and 336 are generally represented by thinner arrows.

Figure 6:
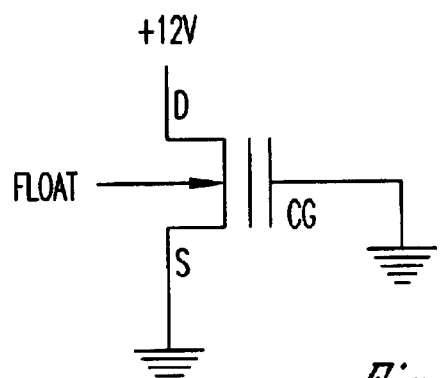
FIG. 6 illustrates operating conditions for writing an NFET nonvolatile device of FIG. 1.

FIG. 4 illustrates charge transport for a Write Process defined as a transition from a conducting low threshold (0) to a nonconducting high threshold (1), using the band diagram of FIG. 2. During the write process, a +12 V programming voltage is applied to the substrate via the drain diffusion as shown in FIG. 6, while the control gate is grounded to 0 V. It is noted that the programiming voltage is brought into the specific cell via its drain (n+) diffusion while the substrate is made to float. During such process, the channel of the specific cell gets capacitively coupled and rises to the same potential as the drain. In one embodiment, if a block of cells is to be written simultaneously, the relevant substrate block and drain nodes are held together during such writing process. Prior to the writing onset, the specific cell holds a built-in positive potential at the floating gate due to the trapped holes (being in the erased conducting state). During writing, the substrate potential rises to +12 V and with coupling coefficient of the cell designed to be k<0.5, more than half of the 12 Volts is imposed between the floating gate and the control gate. This potential is further enhanced by the built-in potential of the holes in the floating gate. As a result, the field (EMF) between the floating gate and the control gate attains significantly higher value as compared to that between the substrate and the floating gate at the onset of the writing process. This high field induces hole emission and transport 436 from the floating gate to the control gate. Simultaneously, this high field also induces complementary electron injection and transport 438 from the control gate to the floating gate as shown in FIG. 4. Mechanism 436 involves the positive charge removal from the floating gate while mechanism 438 involves positive charge neutralization and or negative charge storage into the floating gate. Both of these involves positive charge neutralization and or negative charge storage into the floating gate. Both of these mechanisms are expected to dominate during the writing process resulting in net negative charge storage in the floating gate and transition of the cell to the non-conducting high threshold state. Some loss of electrons from the silicon floating gate to the silicon substrate defined as mechanism 440 is feasible at the initial transient period when the field associated with the floating gate and the substrate is maximum. But this mechanism is relatively weak due to the low field (k<0.5) between the floating gate and the substrate. This is represented by an arrow of intermediate thickness. The remaining mechanism 442, as shown in FIG. 4, is insignificant due to the high hole energy barrier of 4.7 ev and the low field across $SiO_2$—$Ta_2O_5$ between the silicon substrate and the silicon floating gate. This is represented by a thinner arrow. Therefore, primary charge transport between the silicon floating gate and the aluminum control gate is also maintained by this invention during the write process.

The band diagrams of FIGS. 2–4 are useful to show the retention enhancement and read-disturb immunity of the nonvolatile device of the present invention. Typically, for a device design employing a power supply of 2.5 V to 3.3 V (Vdd), the threshold differential between the states 0 and 1 is around 2–3 V. For a worst case stack design of K=0.5, the built-in potential is less than 1.5 V and therefore the associated internal field due to the stored hole charge may not exceed 2.5 E6 V/CM. Hole emission is negligible since the hole barrier is high to both the first insulator region and also the second insulator region (3.1 ev to $ZrO_2$ and 2.9 ev to $Ta_2O_5$). Additionally, electron emission from the substrate and from the control gate are negligible since the electron barrier is high (3.2 ev from the substrate to the first insulator region and 3.8 ev from the control gate to the second insulator region). Therefore, the charge retention for the nonvolatile device of the present invention is expected to be excellent.

Figure 7:
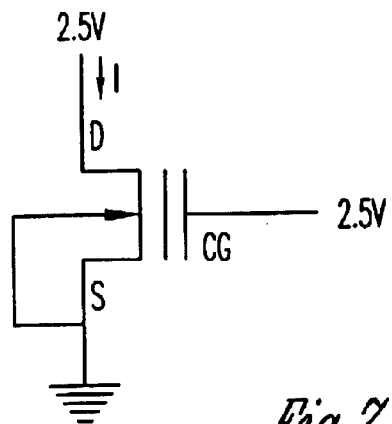
FIG. 7 illustrates operating conditions for reading an NFET nonvolatile device of FIG. 1.

With respect to the read-disturb immunity, a positive potential of Vdd is applied to the control gate and the bit line while the substrate and the source is held to the ground potential during a read pulse as shown in FIG. 7. For those word line bits at 0 state in which the floating gate is storing holes and is providing a built-in potential, the peak field may exceed 4E6 V/CM. However, lower mobility of holes and higher barrier height would prevent any significant charge loss compared to a conventional design. On the other hand, for bits at 1 state, the field is reduced to less than 2.5 E6 V/CM. Therefore, electron emission and tunneling from the floating gate is expected to be negligible even with a relatively lower 1.5 ev barrier height from the floating gate to the $ZrO_2$ of the second insulator region. As such, the read-disturb immunity for the nonvolatile device of the present invention is expected to be significantly enhanced.

FIGS. 5–7 generally illustrate the operating conditions for one embodiment of the nonvolatile device of the present invention. The equivalent oxide thickness ($t_{ox.eq.}$) of the gate stack is approximately 10 nm, wherein the thickness of $SiO_2$ is approximately 2 nm, the $t_{ox.eq.}$ of $Ta_2O_5$ is approximately 4 nm, and the $t_{ox.eq.}$ of $ZrO_2$ is approximately 4 nm. In this embodiment, the power supply voltage is approximately 2.5 V, the threshold voltage in the nonconducting state (VT(1)) is approximately 2.5–3.0 V and the threshold voltage in the conducting state (VT(0)) is approximately 0.5–1.0 V.

FIG. 5 illustrates operating conditions for erasing an NFET nonvolatile device of FIG. 1. Erasing the NFET nonvolatile device involves a transition from a nonconducting state 1 to a conducting state 0. As such, holes are to be transported into and/or electrons are to be transported off the floating gate to lower the threshold voltage from VT(1) to VT(0). The drain voltage (Vdd), the source voltage (Vss), and the substrate voltage (Vsx) are pulled to the ground potential. A positive programming pulse is applied to the control gate as the control gate voltage (Vcg). In one embodiment, the programming pulse is approximately +12 V. In one embodiment, the +12 V programming pulse has a duration approximately in the range of 1 to 10 msec. One of ordinary skill in the art will understand that this programming pulse is capable of being produced from the 2.5 V power supply using charge pumps.

FIG. 6 illustrates operating conditions for writing an NFET nonvolatile device of FIG. 1. Writing the NFET nonvolatile device involves a transition from a conducting state 0 to a nonconducting state 1. As such, electrons are to be transported into and/or holes are to be transported off of the floating gate to raise the threshold voltage from VT(0) to VT(1). The substrate voltage (Vsx) is allowed to float, and the source voltage (Vss) and the control gate voltage (Vcg) are pulled to the ground potential. A positive programming pulse is applied to the drain to enable the substrate voltage (Vsx) to float up by capacitive coupling. In one embodiment, the programming pulse is approximately +12 V. In one embodiment, the duration of the +12 V programming pulse is approximately 1 to 10 msec. One of ordinary skill in the art will understand that this programming pulse is capable of being produced from the 2.5 V power supply using charge pumps.

FIG. 7 illustrates operating conditions for reading an NFET nonvolatile device of FIG. 1. The power supply voltage (Vdd), e.g. 2.5 V, is applied at both the drain node as well as at the control gate (Vcg). The substrate voltage (Vsx) and the source voltage (Vss) are pulled to the ground potential. Current (I) is sensed between the source and the drain to determine if the NFET nonvolatile device is in a conducting low threshold state 0 or in a nonconducting high threshold state 1.

Figure 8:
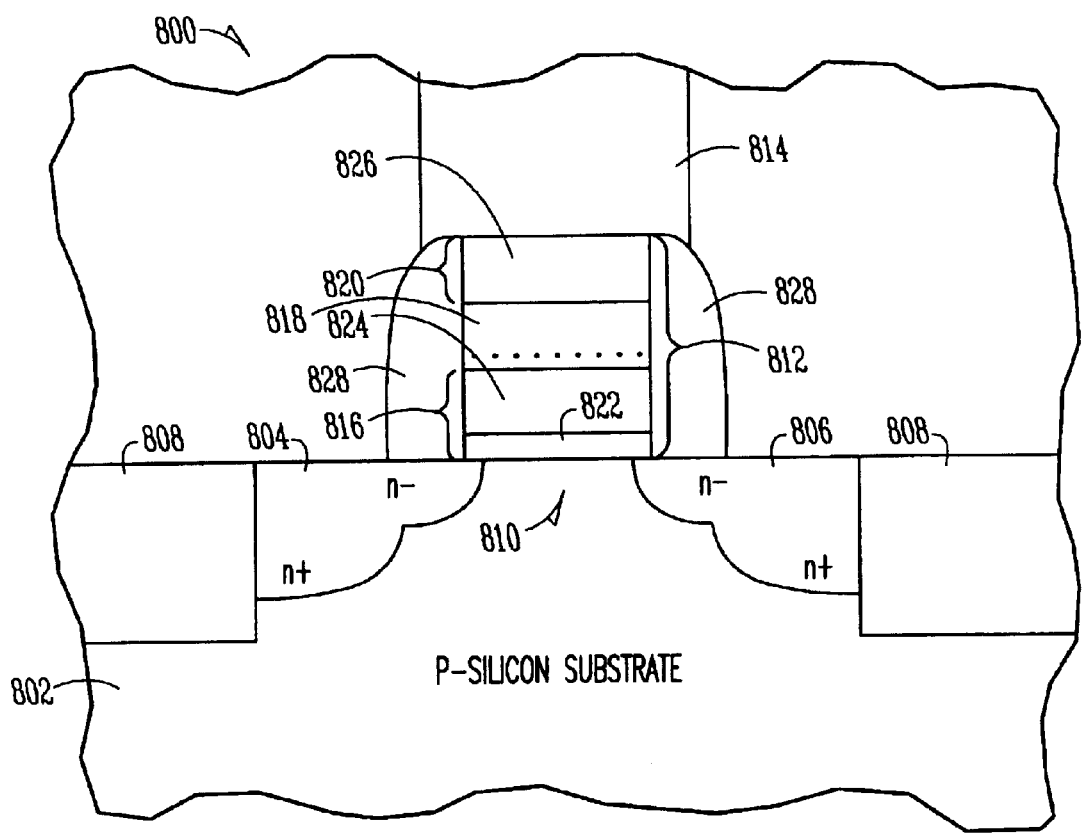
FIG. 8 illustrates one embodiment of a floating plate embodiment of the nonvolatile device of the present invention.

FIG. 8 illustrates one embodiment of a floating plate embodiment of the nonvolatile device of the present invention. The device is similar to that shown in FIG. 1, except that a floating plate replaces the floating gate as the floating charge-storage region. As will be explained in more detail below, the floating plate has silicon nano crystals that enhance field emissions and is at least an order of magnitude thinner (<10 nm) than the thickness of the floatin gate.

The device 800 is formed on a substrate 802. In one embodiment, the substrate includes p–silicon. A first source/drain region 804 and a second source/drain region 806 are formed in the substrate between isolation regions 808. The source/drain regions are separated by a channel region 810 of the substrate. In one embodiment, each of the source/drain regions include n–silicon source/drain extensions positioned to define the channel region in the substrate, and n+silicon used to provide regions for a drain contact and a source contact.

An asymmetric gate stack 812 is formed over the channel region of the substrate. The gate stack separates a control gate 814 from the substrate. According to one embodiment, the control gate includes aluminum, and is connected to an aluminum word line. One embodiment of the asymmetric gate stack 812 includes a first insulator region 816, a floating plate 818 that functions as a floating charge-storage region, and a second insulator region 820. The gate stack is engineered to provide the desired asymmetric barrier energies for charge transport between the three nodes (substrate, floating charge-storage region, and control gate) of the device, and is further engineered to provide the desired electric fields between the three nodes of the device.

In one embodiment of the asymmetric gate stack, the first insulator region 816 includes a layer of Silicon Dioxide ($SiO_2$) 822 disposed over the channel region, and a layer of Tantalum Oxide ($Ta_2O_5$) 824 disposed over the layer of $SiO_2$. One embodiment of the layer of $SiO_2$ includes approximately 2 nm of $NH_3$-treated $SiO_2$. Another embodiment of the layer of $SiO_2$ includes approximately 2 nm of NO-treated $SiO_2$. In one embodiment, the layer of $Ta_2O_5$ has an equivalent oxide thickness ($t_{ox.eq}$) of approximately 3 to 5 nm. In one embodiment, the layer of $Ta_2O_5$ has an equivalent oxide thickness ($t_{ox.eq}$) of approximately 4 nm. A layer of Zirconium Oxide ($ZrO_2$) 826 is disposed on the silicon floating plate. In one embodiment, the layer of $ZrO_2$ has an equivalent oxide thickness ($t_{ox.eq}$) of approximately 4 to 5 nm. An Oxide-Nitride-Oxide (ONO) sidewall 828 surrounds the asymmetric gate stack 812 and isolates the device from other integrated circuit devices.

One embodiment includes a thin layer of silicon-rich-oxide (SRO) as the floating plate 818. Another embodiment includes a thin layer of silicon-rich-nitride (SRN) as the floating plate 818. The actual thickness of the floating plate is approximately between 3 nm to 10 nm. The equivalent oxide thickness ($t_{ox.eq}$) of the floating plate is approximately between 1.5–5 nm. In one embodiment, the floating plate has a thickness of about 5 nm and an equivalent oxide thickness (tox.eq) of about 2.5 nm. The characteristics of SRO and SRN will be described in more detail below with respect to FIGS. 9–13.

As an overview, SRO and SRN contain silicon nano crystals that are capable of storing charge. These silicon nano crystals are capable of simultaneously acting as charge trapping centers as well as charge emission centers. The silicon nano crystals modulate the local potential distributions and enhance the field emission. For effective charge storage, one embodiment includes a desired composition for SRO that has a refractive index of 1.6, and a desired composition for SRN that has a refractive index of 2.2. Other embodiments employ a wider range of composition of SRO or SRN. The refractive index of SRO and SRN is developed below with respect to FIGS. 9–13. The enhanced field emissions allow floating plate devices to be programmed at a significantly reduced average field of approximately 7E6 V/CM as compared to the floating gate device programming field of 12E6 V/CM. The endurance (write-erase cycles before failure) of the device is enhanced by many orders of magnitude by the lower effective programming field. The programming voltage for the floating plate embodiment of FIG. 8 is +/–9 V for a total gate stack equivalent oxide thickness (tox.eq) of 13 nm including the SRO/SRN layer; whereas the programming voltage for the floating gate embodiment of FIG. 1 is +/–12 V.

Figure 9:
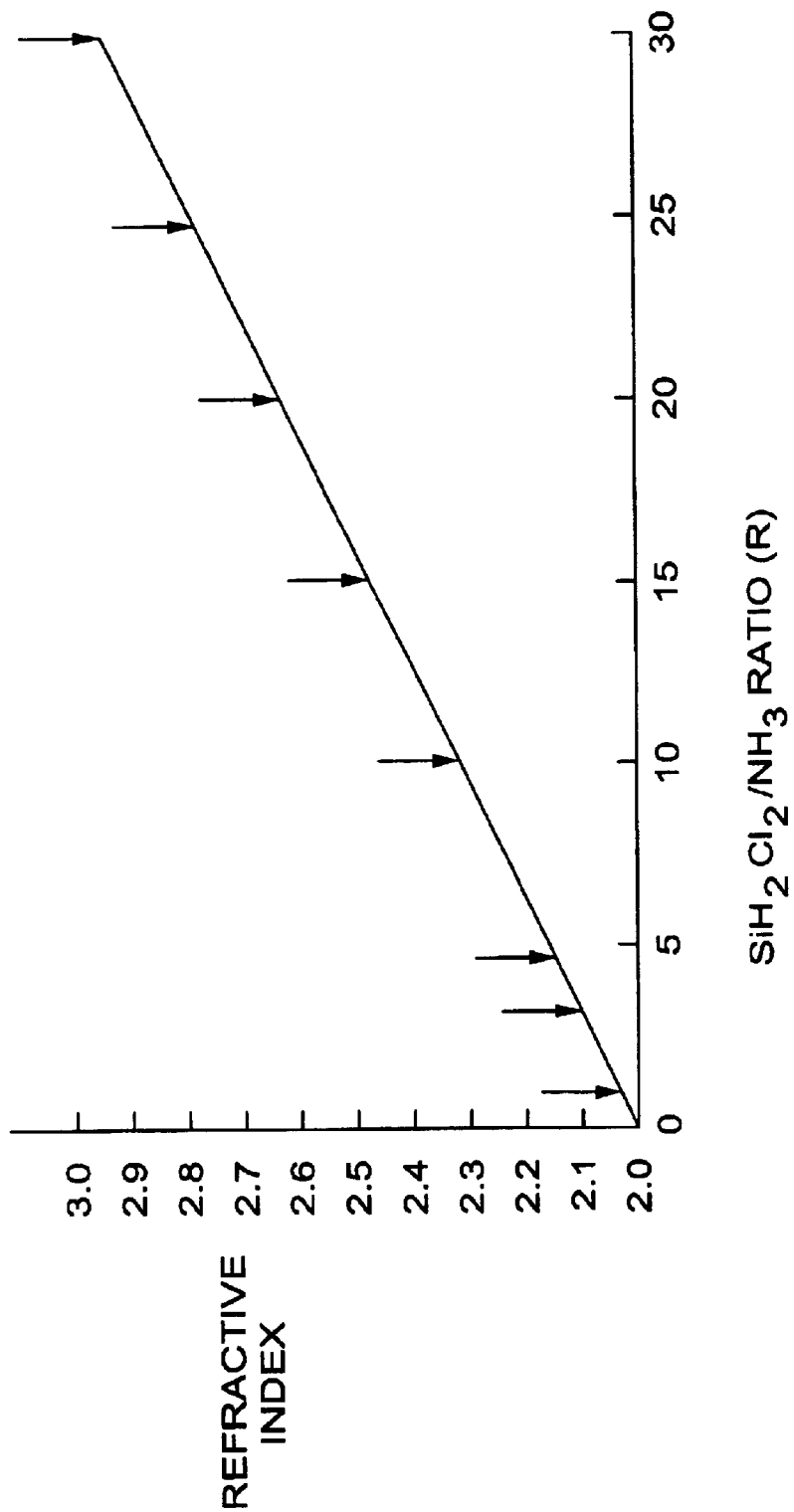
FIG. 9 is a graph showing refractive index of silicon-rich silicon nitride films versus $SiH_2Cl_2/NH_3$ flow rate ratio.

FIGS. 9–13 show relevant properties of silicon rich insulators (SRI) from the standpoint of charge trapping and charge injection or emission. FIG. 9 is a graph showing refractive index of silicon-rich silicon nitride films versus $SiH_2Cl_2/NH_3$ flow rate ratio (R). This graph is provided herein to illustrate the known relationship between the silicon amount and the refractive index. The graph indicates that the index of refraction increases linearly with increasing silicon content. As such, the index of refraction of the films can be used as an indication of the silicon content of the films. The arrows on the graph illustrate experimental ratios.

Figure 10:
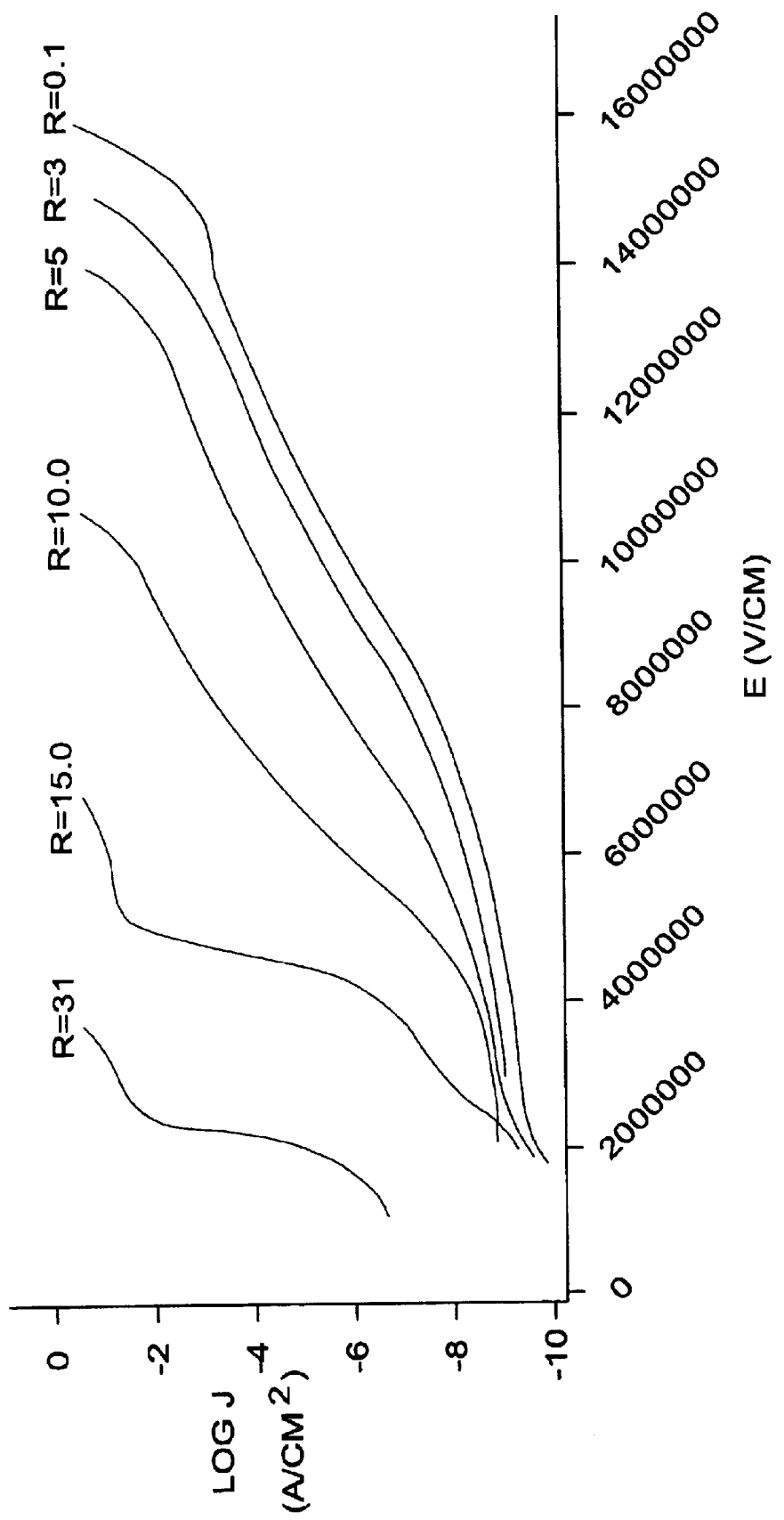
FIG. 10 is a graph showing current density versus applied field for silicon-rich silicon nitride films having different percentages of excess silicon.

FIG. 10 is a graph showing current density versus applied field for silicon-rich silicon nitride films having different percentages of excess silicon. The current density (J) is represented in amperes/$cm^2$, and log J is plotted against the electric field E (volts/cm) for $Si_3N_4$ layers having a $SiH_2Cl_2/NH_3$ flow rate ratio R of 0.1, 3, 5, 10, 15 and 31. This graph is provided herein to illustrate the known relationship between the amount of silicon and the conductivity of the film. The plot shows that the $Si_3N_4$ layers having small additions of silicon (R=3 and 5) exhibit a relatively small conductivity increase over stoichiometric $Si_3N_4$. The plot further shows that increasing silicon content at or above R=10 substantially increases or enhances the conductivity.

Figure 11:
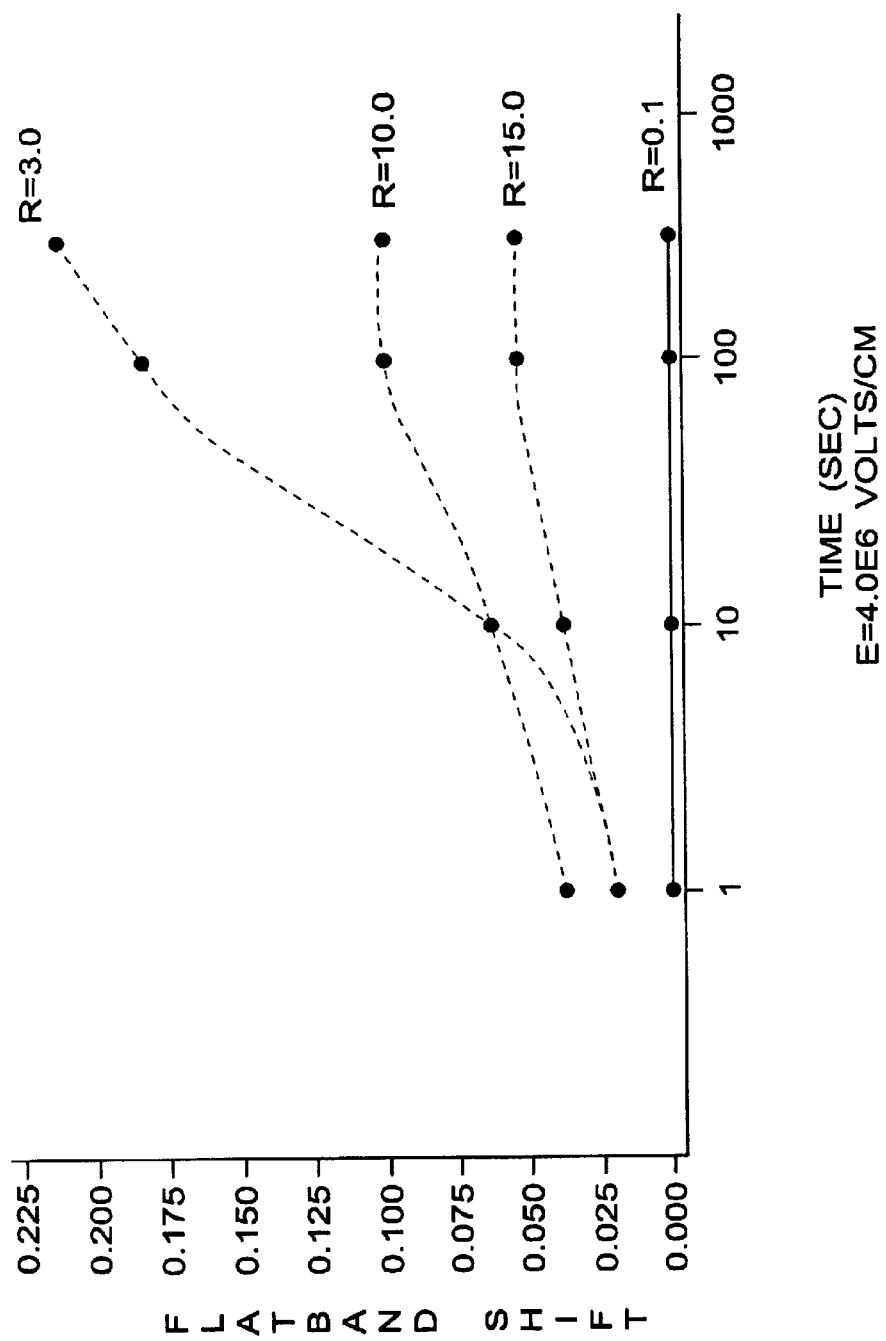
FIG. 11 is a graph showing flat band shift versus time at an applied field of $4 \times 10^6$ volts/cm for silicon-rich silicon nitride films having varying percentages of excess silicon.
Figure 12:
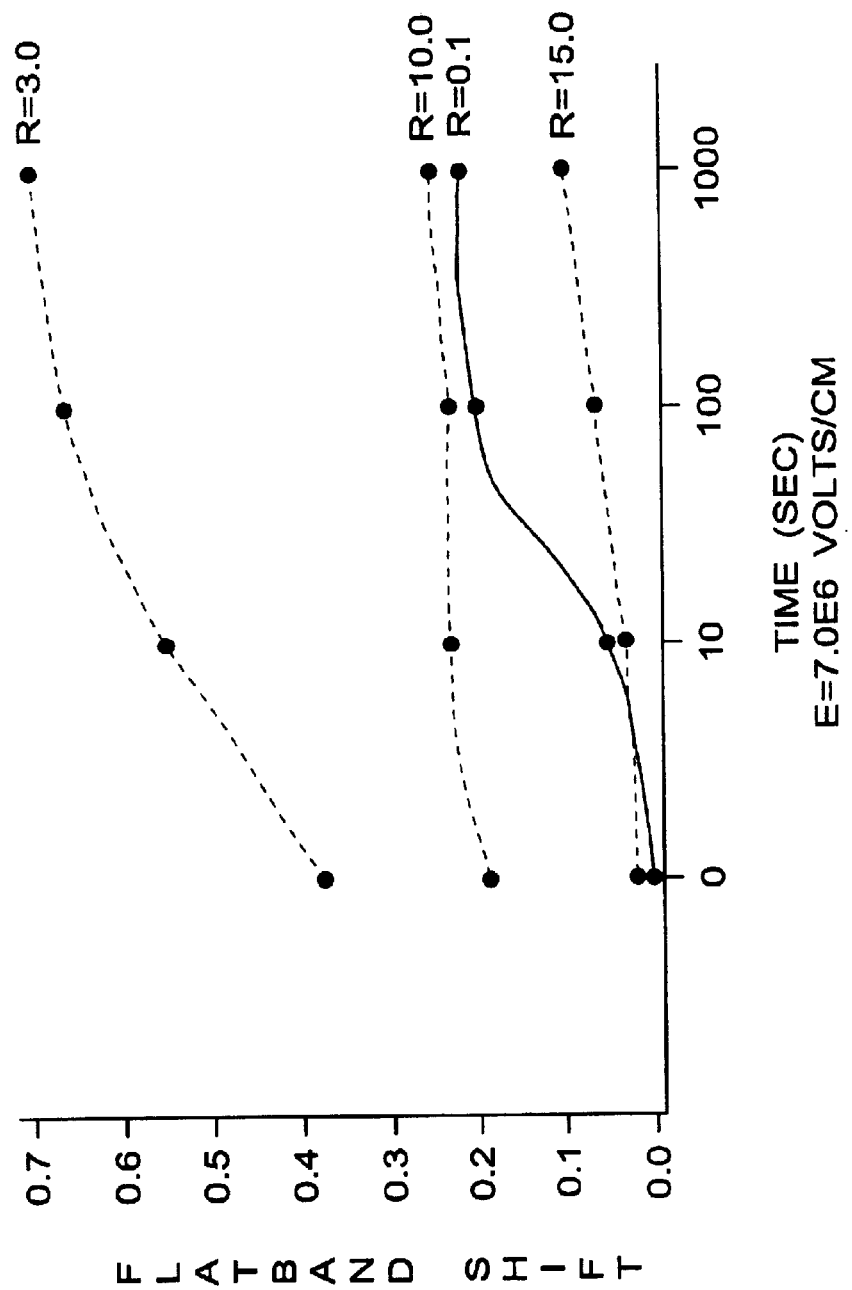
FIG. 12 is a graph showing flat band shift versus time at an applied field of $7 \times 10^6$ volts/cm for silicon-rich silicon nitride films having varying percentages of excess silicon.

FIGS. 11 and 12 provide graphs that illustrate the known relationship between the flatband shift and applied fields for films having varying percentages of excess silicon as represented by the $SiH_2Cl_2/NH_3$ flow rate ratio R. FIG. 11 is a graph showing flatband shift versus time at an applied field of $4 \times 10^6$ volts/cm for silicon-rich silicon nitride films having varying percentages of excess silicon. For R=3, the flatband shift is greater than the shifts produced by films having an R of 0.1, 10 or 15. The film having an R of 10 provides a greater flatband shift than a film having an R of 15. FIG. 12 is a graph showing flatband shift versus time at an applied field of $7 \times 10^6$ volts/cm for silicon-rich silicon nitride films having varying percentages of excess silicon. The flatband shift produced by the R=3 film is even greater than that shown in FIG. 11, while the shifts produced by the R=10 and R=15 films do not change as appreciably. FIGS. 11 and 12 are provided to illustrate the characteristics of a charge storing medium and a more conductive charge injector medium as further explained below.

The graphs of FIGS. 9–12, which were described above, indicate that at low additional silicon content, silicon-rich $Si_3N_4$ films function as a charge storing medium as they exhibit appreciably enhanced trapping characteristics (as shown by the high flatband shifts at moderate and high applied electric fields in FIGS. 11 and 12, respectively) without exhibiting appreciably enhanced conductivity characteristics as shown in FIG. 9.

Silicon-rich silicon nitride films deposited at an R of 3 or 5 (for a refractive index of 2.10 and 2.17, respectively) will possess enhanced charge storing characteristics. This family of silicon rich nitride is identified herein as charge storing SRN or CS-SRN. In general, silicon-rich nitride films having an R greater than 0.1 and less than 10 (or, more specifically, having an index of refraction between approximately 2.10 and 2.30) will provide appreciably enhanced charge trapping or charge storing properties without providing appreciably enhanced charge conduction. This charge trapping is characteristic of a charge storing medium that can be used as a floating plate within a gate stack of a NV device as illustrated in FIG. 8.

Silicon-rich nitride films having an R greater than 10 (or, more specifically, having an index of refraction greater than 2.3) are referred to as an injector medium. Silicon nitride injectors are preferred over silicon oxide injectors because of the superior high temperature stability of the former material. Silicon readily diffuses within silicon oxide at elevated processing temperatures, which disrupts the injection threshold by reducing the localized field distortions. However, even at higher processing temperature, silicon does not readily diffuse within $Si_3N_4$. A silicon-rich $Si_3N_4$ (SRN) injector provides appreciably enhanced charge conductance without providing appreciably enhanced charge trapping over stoichiometric $Si_3N_4$. This is illustrated in FIGS. 11 and 12, which shows progressively reduced flatband shifts for R=10 and R=15 with progressively increased conduction. The family of materials acting as injector material is identified as "i-SRN."

Figure 13:
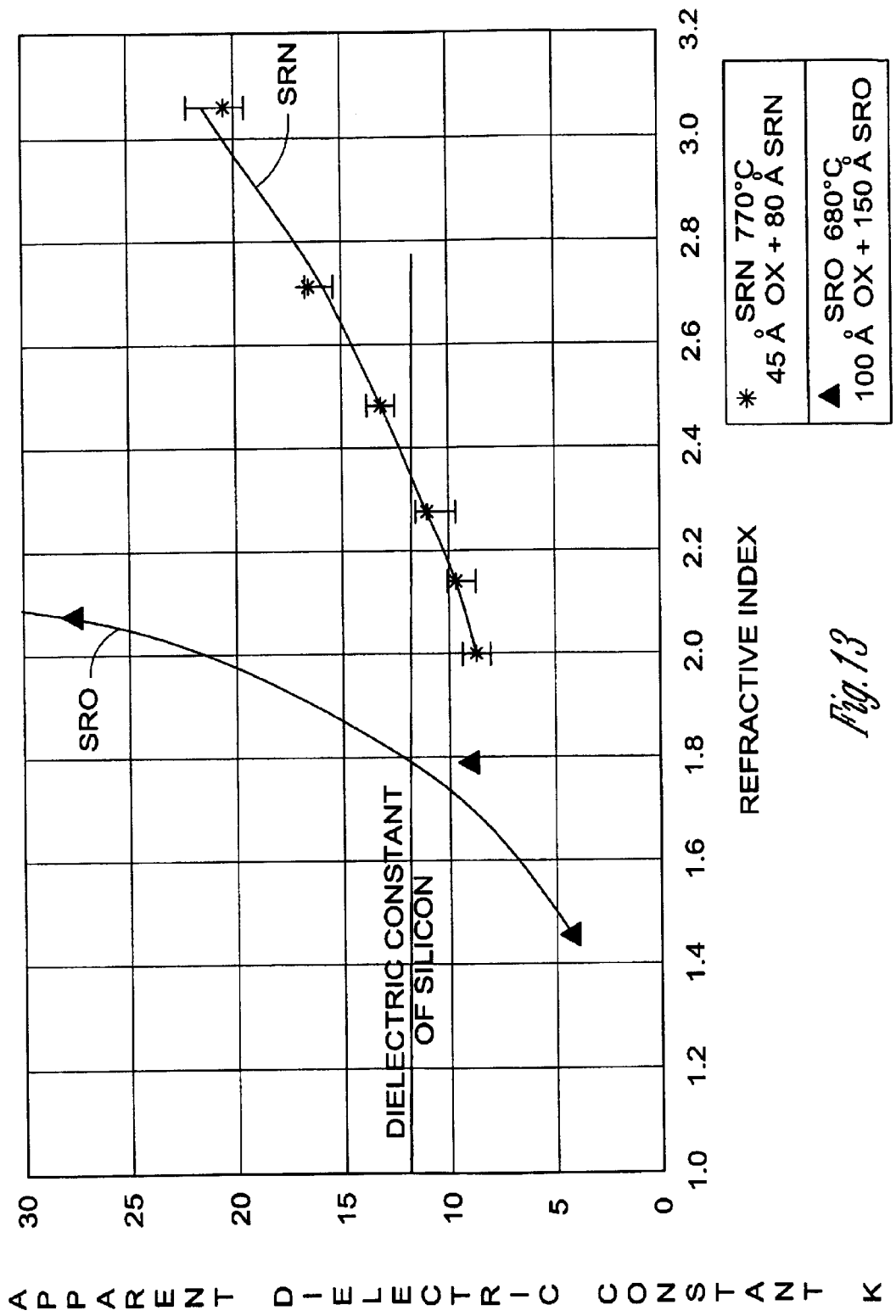
FIG. 13 is a graph showing apparent dielectric constant K versus refractive index for both Silicon Rich Nitride (SRN) and Silicon Rich Oxide (SRO).

FIG. 13 is a graph showing apparent dielectric constant K versus refractive index for both Silicon Rich Nitride (SRN) and Silicon Rich Oxide (SRO). The SRN and SRO plotted in this graph were provided using a Low Pressure Chemical Vapor Deposition (LPCVD) process. The SRO was fabricated at approximately 680° C., and the fabricated structure included 100 Å oxide and 150 Å SRO. The SRN was fabricated at approximately 770° C., and the fabricated structure included 45 Å oxide and 80 Å SRN. As shown in the graph, the dielectric constant of silicon is around 12. Materials with a higher K than silicon are conventionally termed a high K material, and materials with a lower K than silicon are conventionally termed a low K material. SRN that has a refractive index of 2.5 or greater and SRO that has a refractive index of 1.85 or greater have apparent dielectric constants that are greater than 12. Injector SRI includes these high K SRO and high K SRN family of materials. In the present invention, injector SRI layers are employed in the gate stack to further lower the programming field and enhance endurance.

In one embodiment, the floating plate embodiment of FIG. 8 is modified by incorporating an additional thin layer of "injector" SRN (i.e. SRN having a refractive index greater than 2.5) between the aluminum control gate and the $ZrO_2$. In another embodiment, the floating plate embodiment of FIG. 8 is modified by incorporating an additional thin layer of "injector" SRN between the $SiO_2$ and the $Ta_2O_5$. In another embodiment, the floating plate embodiment of FIG. 8 is modified by incorporating one additional thin layer of "injector" SRN between the aluminum control gate and the $ZrO_2$, and another additional thin layer of "injector" SRN between the $SiO_2$ and the $Ta_2O_5$. In one embodiment, the thickness of these thin layers of injector SRN is approximately 2–3 nm. These structures lower the programming field. This concept is generally described and illustrated below in FIGS. 14–19. Applicant discusses this concept in detail in the U.S. patent application entitled "Scalable Flash/NV Structures and Devices With Extended Endurance," Ser. No. 09/944,985, filed on Aug. 30, 2001, which has been incorporated by reference into the present application.

Figure 14:
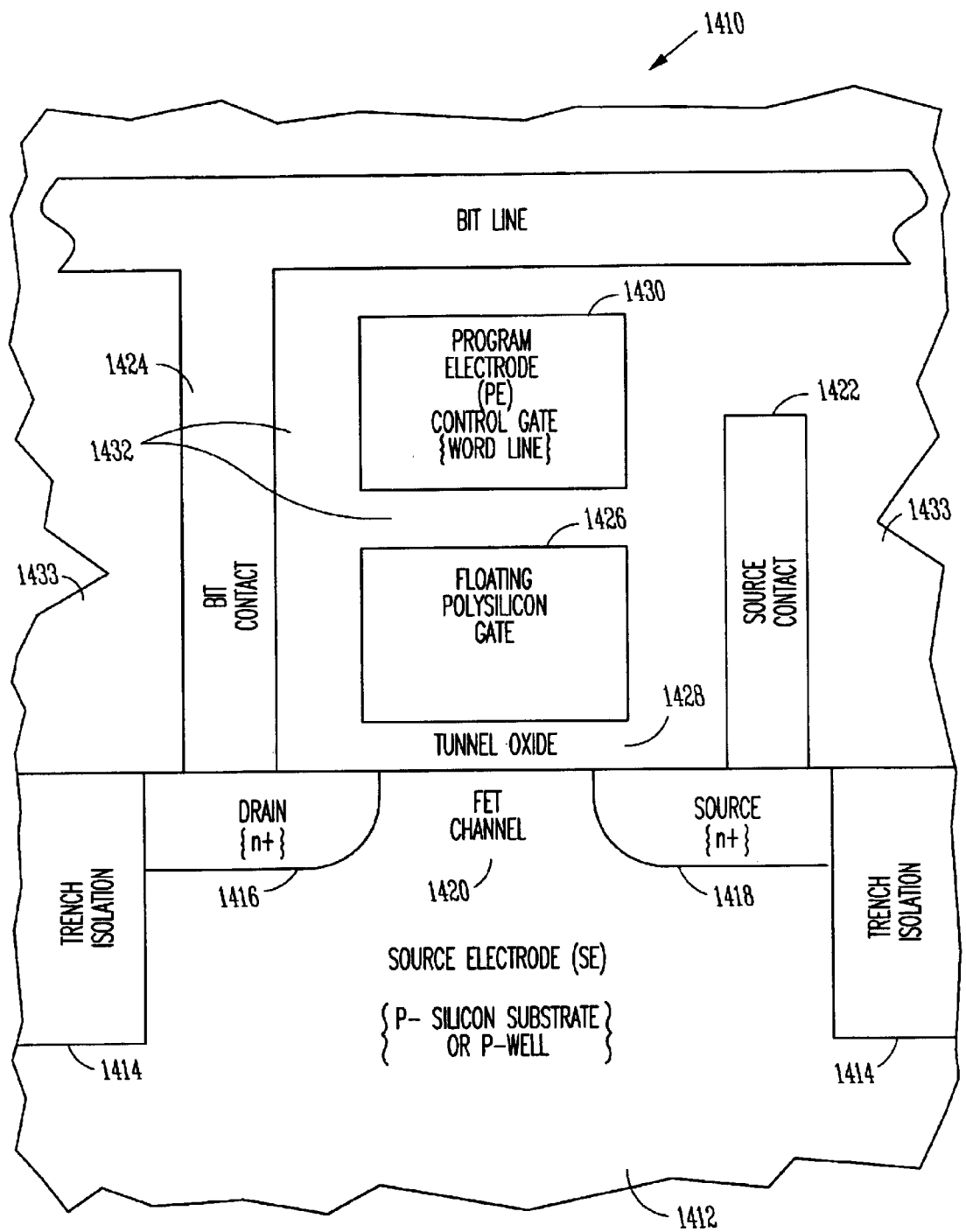
FIG. 14 is a cross-section view of a conventional nonvolatile field effect transistor (NV FET) device.

FIG. 14 is a cross-section view of a conventional non-volatile field effect transistor (NV FET) device. The illustrated device is fabricated on a silicon substrate 1412 such as a p silicon substrate or p-well in which case it is referred to as a source electrode (SE), and is separated from other devices by the isolation trenches 1414. The device 1410 further includes diffused regions that function as a drain region 1416 and a source region 1418, such as the illustrated n+diffused regions in the p substrate. A field effect transistor (FET) channel 1420 is formed in the substrate between the drain and source regions. A source contact 1422 is formed to electrically couple with the source region 1418, and a bit contact 1424 is formed to electrically couple with the drain region 1416. A floating polysilicon gate 1426 is formed over the FET channel 1420, and is separated from the FET channel 1420 by tunnel oxide 1428. A control gate 1430, referred to as a program electrode (PE) for the illustrated embodiment, is formed over the floating polysilicon gate 1426. An oxide/nitride/oxide (ONO) interpoly dielectric 1432 is provided around and between the PE 1430 and the floating gate 1426. A bit line is connected to the bit contact, and a word line is connected to the PE. An oxide 1433 is formed around the NV FET device.

Common dimensions for a typical NV FET device in the 0.13 to 0.15 μm technology generations are provided below. The cell size for a NAND gate is approximately 0.15 μm². The FET channel is approximately 150 nm wide. Both the floating gate and the PE are approximately 150 nm wide and about 250 nm thick. The tunnel oxide separating the floating gate from the FET channel has a thickness 1529 of approximately 8 nm. The ONO interpoly dielectric separating the PE and the floating gate is approximately 15 nm thick. The programming voltage applied to the PE is about 16 volts, and the pulse width of a programming pulse is approximately 1 ms. The field generated across the tunnel oxide is approximately $12 \times 10^6$ V/cm. The minimum program window ($V_T$("1")–$V_T$("0")) is approximately 2 V. The minimum program window is defined as the difference in the threshold voltages for a device with a stored one and a device with a stored zero. The endurance for a typical NV FET device is about $10^5$ write/erase cycles. The power supply $V_{DD}$ is 3.3 V.

Figure 15:
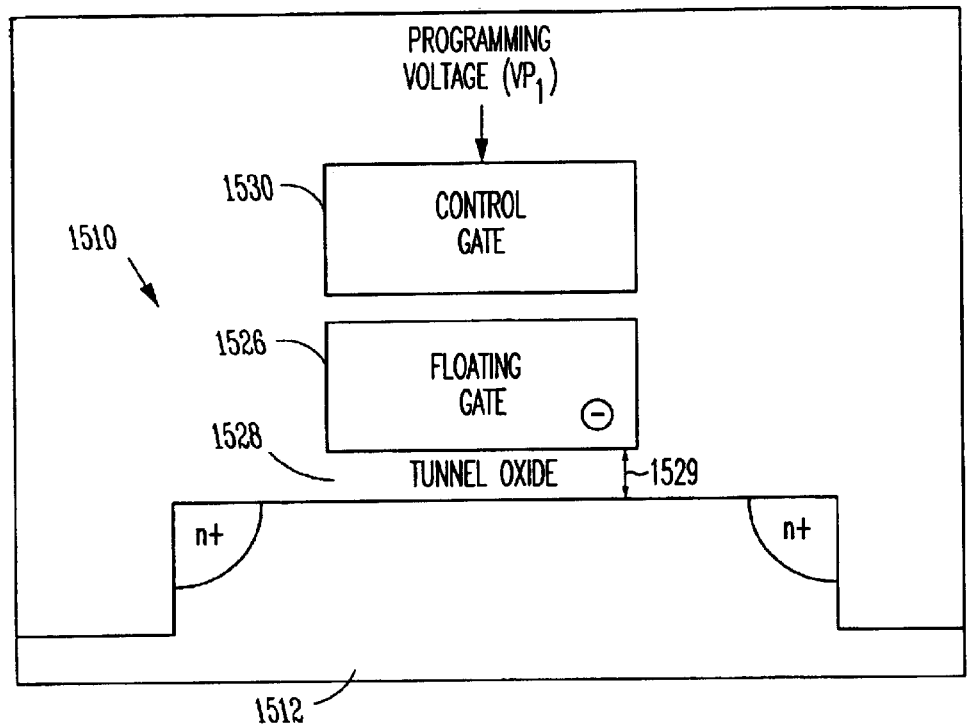
FIG. 15 illustrates the capacitive coupling for a conventional NV FET device.

FIG. 15 illustrates the capacitive coupling for a conventional NV FET device. Again, the device 1510 includes a control gate or PE 1530, a floating gate 1526, and a substrate or SE 1512. A programming voltage $VP_1$ of 16 V is applied to the control gate. The electric field across about 8 nm of tunnel oxide 1528 ($E_{TUN.OX}$) is approximately $12 \times 10^6$ V/cm, which reflects a coupling efficiency of about 60%. The low efficiency is attributable to the geometry and capacitor divider effects of the cell.

Figure 16:
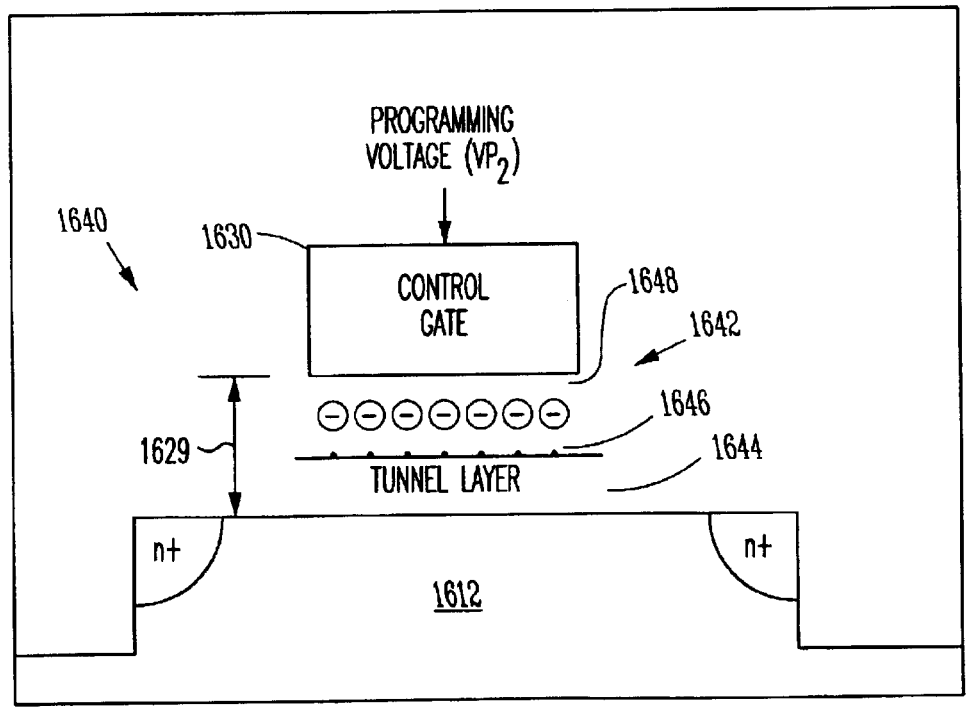
FIG. 16 illustrates the capacitive coupling for a nonvolatile floating plate device.

FIG. 16 illustrates the capacitive coupling for a nonvolatile floating plate device. The device 1640 includes a control gate 1630 separated from a substrate 1612 by a gate insulator stack 1642 having a thickness 1629 of approximately 15 nm. The gate insulator stack 1642 includes a tunnel insulator 1644, charge centers 1646 that form a floating plate capable of storing charge, and a charge blocking dielectric 1648. A programming voltage $VP_2$ of 9.6 V is applied to the control gate 1630. As there is no separate floating gate, the coupling efficiency is 100%. The average electric field $E_{AVG}$ between the control gate 1630 and the substrate 1612 is between about 6 to $7 \times 10^6$ V/cm.

Figure 17:
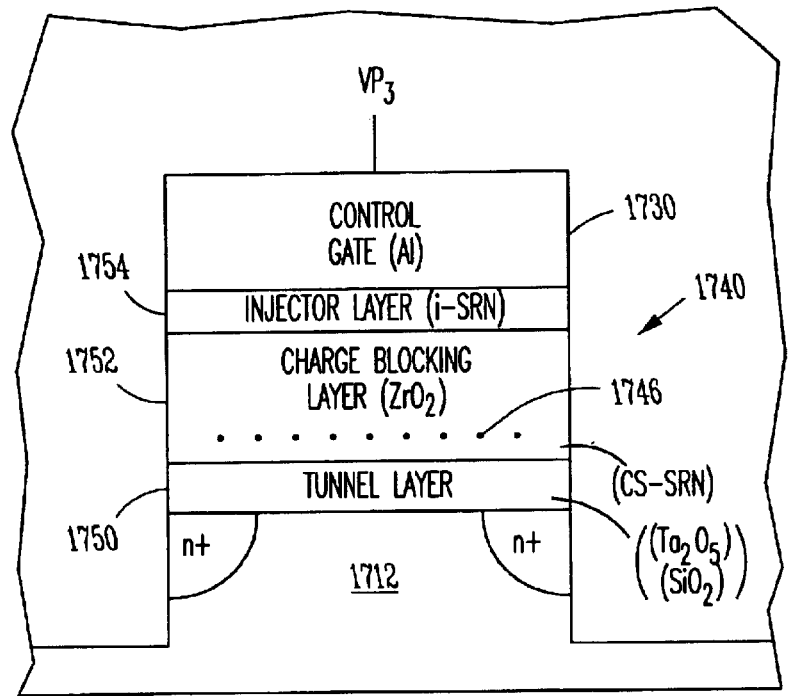
FIG. 17 illustrates the average field enhancement due to the incorporation of a top injection layer in a gate stack for a nonvolatile floating plate device.

FIG. 17 illustrates the average field enhancement due to the incorporation of a top injection layer in a gate stack for a nonvolatile floating plate device. In this illustration, the gate insulator stack 1740, which is interposed between the control gate 1730 and the substrate 1712, includes a tunnel layer 1750 that includes $SiO_2$ and $Ta_2O_5$, a charge blocking layer 1752 that includes charge centers (CS-SRN) 1746 that form a floating plate or a charge storing medium, a charge blocking layer that includes $ZrO_2$, and an injector layer (i-SRN) 1754. The injector layer (i-SRN) 1754 enhances the average electric field by a factor of about 1.5 (1.5×) across the entire gate stack. A programming voltage $VP_3$ of 5.5 to 6.5 V is applied to the control gate 1730. The resulting average electric field $E_{AVG}$ between the control gate 1730 and the substrate 1712 is reduced to about $4 \times 10^6$ V/cm.

Figure 18:
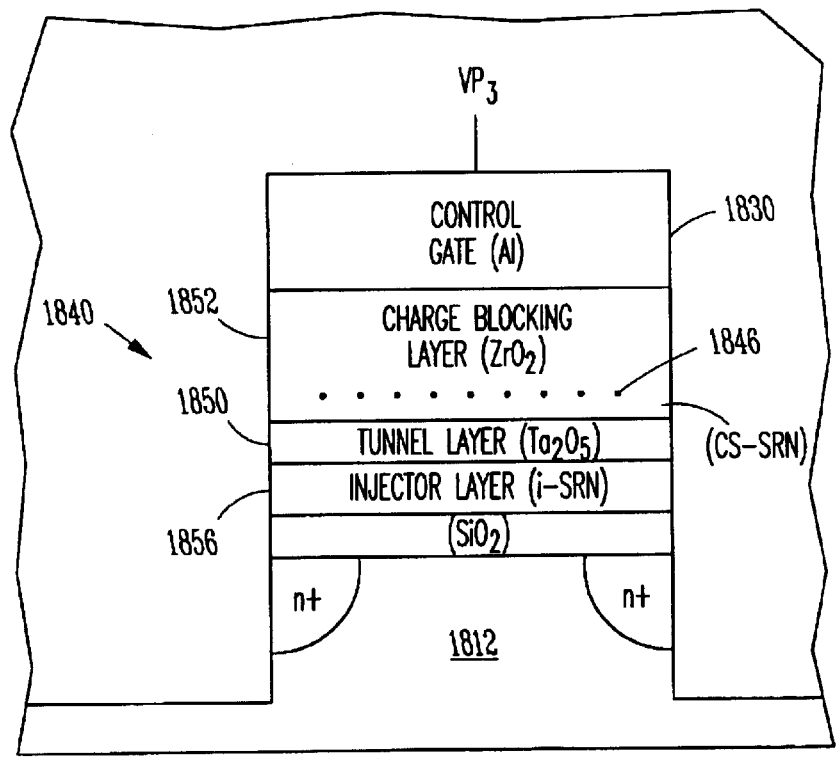
FIG. 18 illustrates the average field enhancement due to the incorporation of a bottom injection layer in a gate stack for a nonvolatile floating plate device.

FIG. 18 illustrates the average field enhancement due to the incorporation of a bottom injection layer in a gate stack for a nonvolatile floating plate device. In this illustration, the gate insulator stack 1840, which is interposed between the control gate 1830 and the substrate 1812, includes an injector layer (i-SRN) 1856 over $SiO_2$, a tunnel layer of $Ta_2O_5$ 1850, and a charge blocking layer of $ZrO_2$ 1852 that includes charge centers (CS-SRN) 1846 to form a floating plate or a charge storing medium. In this embodiment, a programming voltage $VP_3$ of 5.5 to 6.5 V is applied to the control gate 1830. The resulting average electric field $E_{AVG}$ between the control gate 1830 and the substrate 1812 is reduced to about $4 \times 10^6$ V/cm. This illustrates that the same general results are achieved whether the injector layer is on top of the gate insulator stack or on the bottom of the gate insulator stack. That is, the injector layer (i-SRN) enhances the electric field by a factor of about 1.5×.

Figure 19:
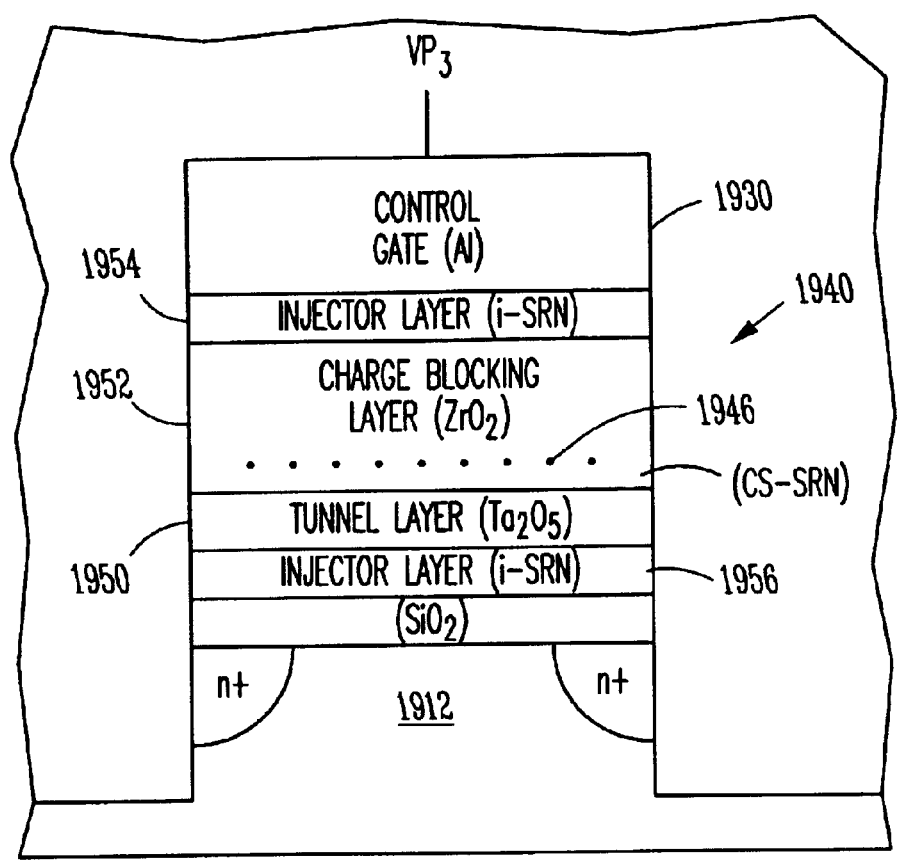
FIG. 19 illustrates the average field enhancement due to the incorporation of both a top injection layer and a bottom injection layer in a gate stack for a nonvolatile floating plate device.

FIG. 19 illustrates the average field enhancement due to the incorporation of both a top injection layer (i-SRN) and a bottom injection layer (i-SRN) in a gate stack for a nonvolatile floating plate device. In this illustration, the gate insulator stack 1940, which is interposed between the control gate 1930 and the substrate 1912, includes a first injector layer SRN 1956 over a thin $SiO_2$ layer, a tunnel layer of $Ta_2O_5$ 1950, a charge blocking layer of $ZrO_2$ 1952 that includes charge centers (CS-SRN) 1946 that form a floating plate or a charge storing medium, and a second injector layer (i-SRN) 1954 on top of $ZrO_2$. The use of an injector layer on the top and on the bottom of the gate insulator stack enhances the electric field by a factor of about 1.7 (1.7×). A programming voltage $VP_3$ of 5.5 to 6.5 V is applied to the control gate 1930. The resulting average electric field $E_{AVG}$ between the control gate 1930 and the substrate 1912 is reduced to about $3.5 \times 10^6$ V/cm.

Memory Array Level

Figure 20:
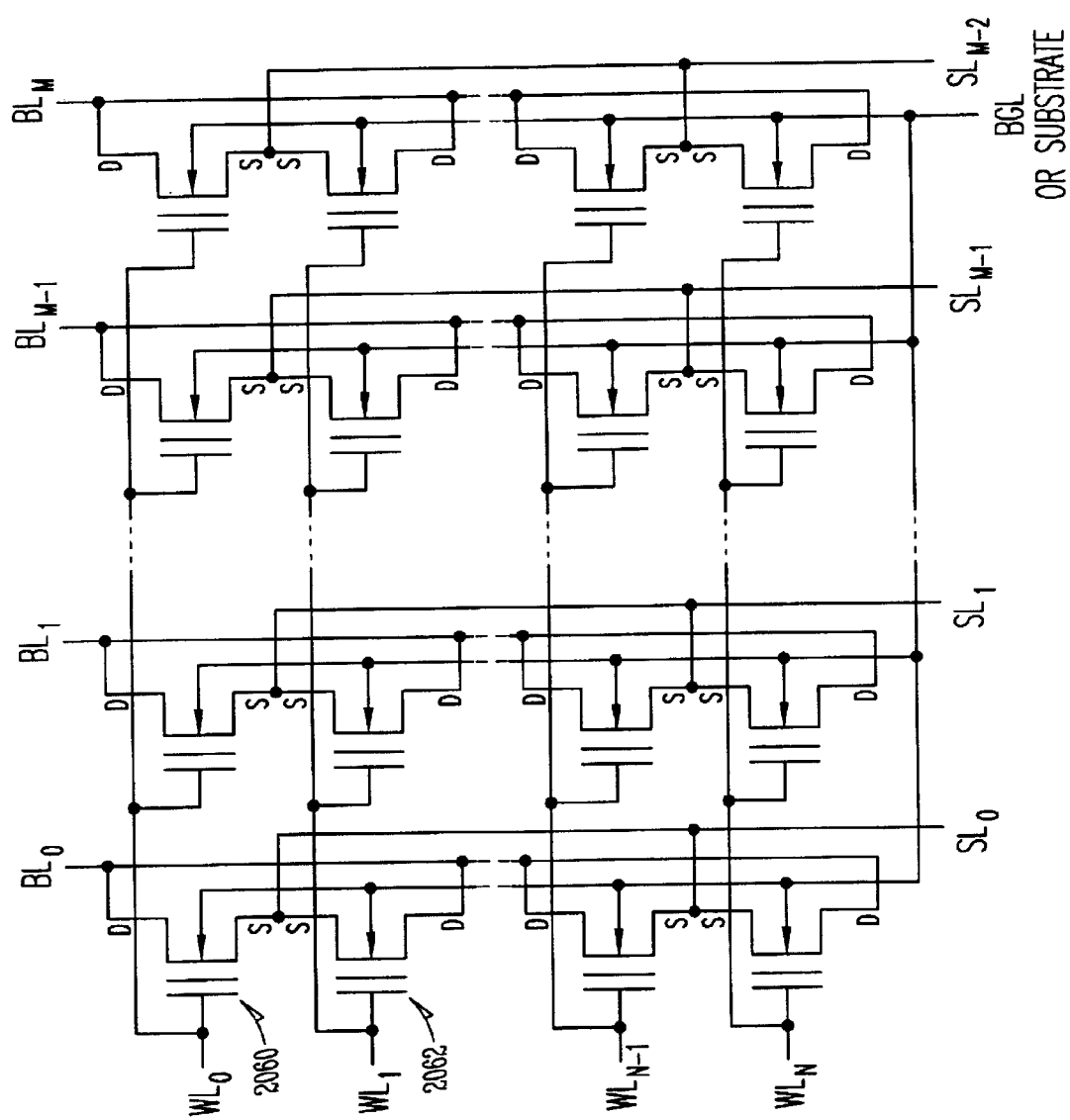
FIG. 20 illustrates one memory array embodiment according to the present invention.

FIG. 20 illustrates one memory array embodiment according to the present invention. The memory array includes at least one block of memory cells. The cells are arranged in rows and columns. All of the cells in a particular column have drains D connected to a common bit line BL and all of the cells in a particular row have control gates connected to a common word line WL. The bit lines BL are identified as BL0–BLM and the word lines WL are identified as WL0–WLN. The figure illustrates that all of the cells in a column have sources S connected to a common source line SL0, SL1, etc., but the invention is not so limited. Other sources lines are capable of being used to connect to the source S of various cells in the array. A single source line is capable of being connected to the source S of a number of columns, and is capable of connecting the sources of all of the cells of the array to a ground potential. According to various embodiments, various numbers of cells are capable of being incorporated in a block or an array. The figure illustrates that the backgate or substrate of all of the cells are connected together via a backgate line (BGL). The invention is not limited to a single backgate line as additional backgate lines may be used. For example, various backgate lines are capable of being used for arrays of NFET memory devices that use p-wells to isolate the substrate of selected cells from the substrate of other cells.

The cells are arranged in column pairs, with each cell of the pair sharing a common source S. For example, cell pair 2060 and 2062 have a common source S connected to the source line SL. The drains D of the cells are connected to the bit line BL associated with the column in which the cells are located. For example, the cell pair 2060 and 2062 have their drains D connected to a common bit line BL1.

One of the cells in the block of cells in the array is selected according to address signals on address lines. The address signals are decoded to select the lines that identify one cell. These lines used to identify one cell include the word line and the bit line. Additionally, since more than one source line and/or backgate may be present, the appropriate source line and/or backgate line needed for programming can be decoded from the address. A selected cell is capable of being programmed (i.e. written/erased) and read.

A selected cell(s) is written (low to high threshold transition) by pulling the appropriate source line(s) and word line(s) to a ground potential, raising the appropriate bit line(s) to +12 V by applying a programming pulse for approximately 10 msec., for example, while letting the substrate float.

A selected cell(s) is erased (high to low threshold transition) by pulling the appropriate source line(s) and bit line(s), as well as the substrate of the selected cells, to a ground potential, and applying a positive programming pulse +12 V for approximately 10 msec., for example, to the appropriate word line(s).

A selected cell is read by pulling the appropriate source line, as well as the substrate of the selected cell, to a ground potential, by applying Vdd, such as a Vdd of approximately +2.5 V, to the appropriate bit line and word line, and by sensing the current on the bit line to determine if the selected cell is in a conducting low threshold state 0 or in a nonconducting high threshold state 1.

System Level

Figure 21:
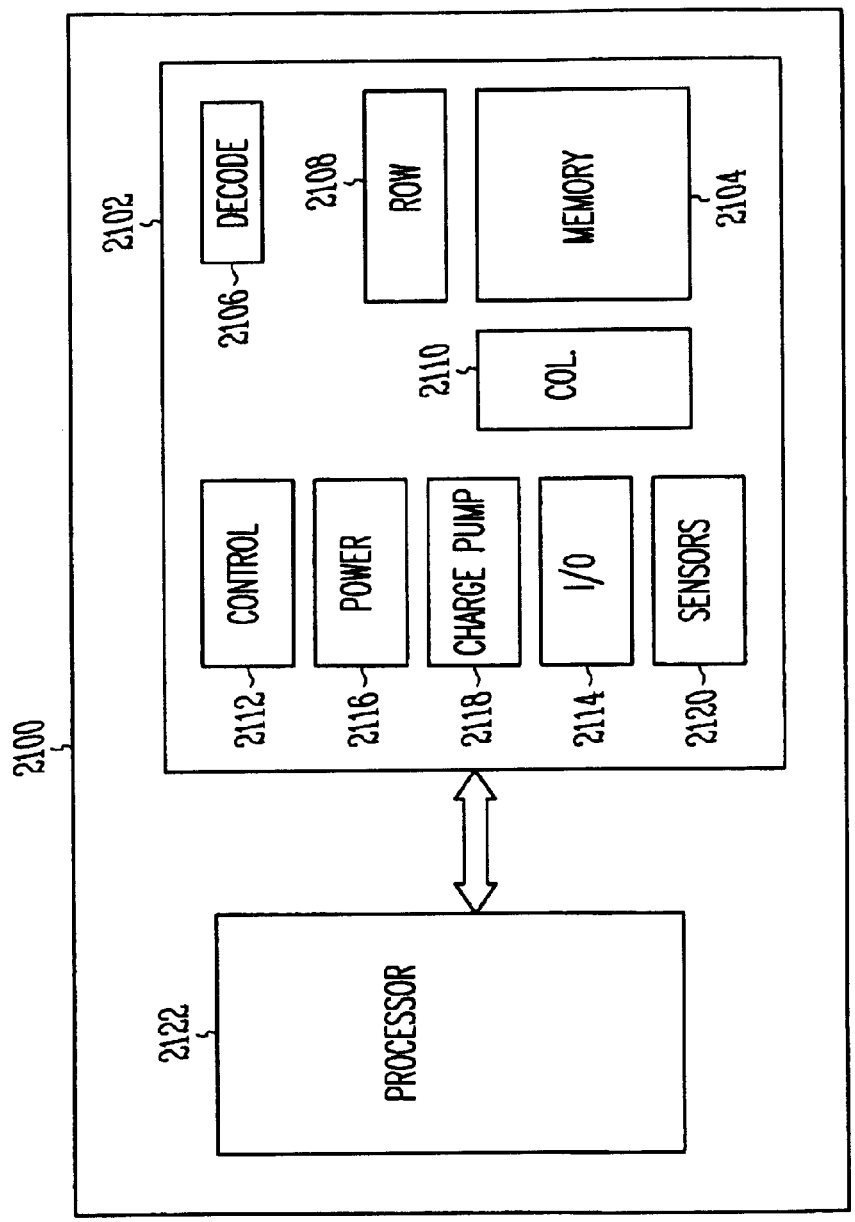
FIG. 21 is a simplified block diagram of a high-level organization of an electronic system according to the teachings of the present invention.

FIG. 21 is a simplified block diagram of a high-level organization of an electronic system according to the teachings of the present invention. The system 2100 includes a memory device 2102 which has an array of memory cells 2104, address decoder 2106, row access circuitry 2108, column access circuitry 2110, control circuitry 2112 for controlling operations, and input/output circuitry 2114. The memory device 2102 further includes power circuitry 2116, a charge pump 2118 for providing the higher-voltage programming pulses, and sensors 2120 such as current sensors for determining whether a memory cell is in a low-threshold conducting state or in a high-threshold nonconducting state. Also, as shown in FIG. 21, the system 2100 includes a processor 2122, or memory controller for memory accessing. The memory device 2102 receives control signals 2124 from the processor 2122 over wiring or metallization lines. The memory device 2102 is used to store data which is accessed via I/O lines. It will be appreciated by those skilled in the art that additional circuitry and control signals can be provided, and that the memory device 2102 has been simplified to help focus on the invention. At least one of the processor 2122 or memory device 2102 has a memory cell formed according to the embodiments of the present invention. That is, at least one of the processor 2122 or memory device 2102 includes an asymmetrical band gap engineered nonvolatile memory device that has enhanced data retention and programming speed according to the teachings of the present invention.

It will be understood that the embodiment shown in FIG. 21 illustrates an embodiment for electronic system circuitry in which the novel memory cells of the present invention are used. The illustration of system, as shown in FIG. 21, is intended to provide a general understanding of one application for the structure and circuitry of the present invention, and is not intended to serve as a complete description of all the elements and features of an electronic system using the novel memory cell structures. Further, the invention is equally applicable to any size and type of memory device using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The figures presented and described in detail above are similarly useful in describing the method aspects of the present subject matter. These aspects include, but are not limited to, methods of forming the nonvolatile memory device and arrays of nonvolatile memory devices, and methods of operating the nonvolatile memory devices and arrays of nonvolatile memory devices.

Conclusion

The present subject matter provides nonvolatile memory devices that incorporate a band-gap engineered gate stack with asymmetric tunnel barriers. The gate stack materials are selected with the appropriate energy barrier between the silicon substrate, the floating gate/plate, the control gate, and the respective interface insulators. As such, field emission of carriers is selective to either electrons or holes, and carrier transport is selective between the floating node and the control gate during programming. The selected carrier transport is enhanced between the control gate to the floating gate/plate due to the reduced barrier height at the control gate-insulator interface during programming. Charges are retained in the floating gate/plate due to relatively higher barrier energy at the floating gate-insulator interface caused by the band-gap asymmetry. The insulator at the silicon substrate interface is selected so as to provide large barrier heights for both electrons and holes for minimal emission of carriers from the silicon substrate during write or erase. Additionally, the insulator thickness and stack geometry is designed to provide capacitive coupling K<0.5 to further limit carrier flow from and to the silicon substrate. In this manner, carrier flow is restricted primarily between the control gate and the floating gate/plate in either direction for both write and erase.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A gate stack for a nonvolatile memory cell, comprising:
   a Silicon Dioxide ($SiO_2$) layer in contact with a channel region of the memory cell;
   a Tantalum Oxide ($Ta_2O_5$) layer in contact with the $SiO_2$ layer;
   a charge-storage region in contact with the $Ta_2O_5$ layer; and
   a Zirconium Oxide ($ZrO_2$) layer in contact with the charge-storage layer.

2. The gate stack of claim 1, wherein the $SiO_2$ layer includes approximately 2 nm of $NH_3$ treated $SiO_2$.

3. The gate stack of claim 1, wherein the $SiO_2$ layer includes approximately 2 nm of NO treated $SiO_2$.

4. The gate stack of claim 1, wherein the $Ta_2O_5$ layer includes approximately 3–5 nm $t_{ox.eq.}$ of $Ta_2O_5$.

5. The gate stack of claim 1, wherein the $ZrO_2$ layer includes approximately 3–5 nm $t_{ox.eq.}$ of $ZrO_2$.

6. The gate stack of claim 1, wherein:
   the $SiO_2$ layer includes approximately 2 nm of $SiO_2$;
   the $Ta_2O_5$ layer includes approximately 3–5 nm $t_{ox.eq.}$ of $Ta_2O_5$; and
   the $ZrO_2$ layer includes approximately 3–5 nm $t_{ox.eq.}$ of $ZrO_2$.

7. The gate stack of claim 1, wherein the charge-storage region includes a silicon floating gate.

8. A gate stack for a nonvolatile memory cell, comprising:
   a Silicon Dioxide ($SiO_2$) layer in contact with a channel region of the memory cell;
   a Tantalum Oxide ($Ta_2O_5$) layer in contact with the $SiO_2$ layer;
   a charge-trapping floating plate in contact with the $Ta_2O_5$ layer; and
   a Zirconium Oxide ($ZrO_2$) layer in contact with the charge-storage layer.

9. The gate stack of claim 8, wherein the floating plate includes Silicon-Rich-Oxide (SRO).

10. The gate stack of claim 9, wherein the SRO has a refractive index of approximately 1.6.

11. The gate stack of claim 8, wherein the floating plate includes Silicon Rich-Nitride (SRN).

12. The gate stack of claim 11, wherein the SRN has a refractive index of approximately 2.2.

13. The gate stack of claim 8, further comprising an injector SRN layer disposed between a control gate and the $ZrO_2$ layer.

14. The gate stack of claim 8, further comprising an injector SRN layer disposed between the $SiO_2$ layer and the $Ta_2O_5$ layer.

15. The gate stack of claim 8, further comprising an injector SRN layer disposed between the $SiO_2$ layer and the $Ta_2O_5$ layer and an injector SRN layer disposed between a control gate and the $ZrO_2$ layer.

16. A nonvolatile memory cell, comprising:
- a first source/drain region and a second source/drain region separated by a channel region in a substrate;
- a control gate of predetermined metallurgy; and
- a gate stack separating the control gate from the channel region, the gate stack including:
  - a first insulator region including a Silicon Dioxide ($SiO_2$) layer and a Tantalum Oxide ($Ta_2O_5$) layer;
  - a floating charge-storage region separated from the channel region by the first insulator region; and
  - a second insulator region including a Zirconium Oxide ($ZrO_2$) layer, wherein the control gate is separated from the floating charge-storage region by the second insulator region;
- wherein the gate stack includes selected material for providing desired asymmetric energy barriers in conjunction with the control gate of predetermined metallurgy, and
- wherein the desired asymmetric energy barriers are adapted to:
  - primarily restrict carrier flow during programming to a selected carrier between the control gate and the floating charge-storage region, and
  - retain a programmed charge in the floating charge-storage region.

17. The nonvolatile memory cell of claim 16, wherein the asymmetric energy barriers include a hole energy barrier from the control gate to the floating charge-storage region that is adapted to promote hole transport from the control gate to the floating charge-storage region during a first programming operation.

18. The nonvolatile memory cell of claim 17, wherein the asymmetric energy barriers include an electron energy barrier from the floating charge-storage region that is adapted to promote complementary electron transport from the floating charge-storage region to the control gate during a first programming operation.

19. The nonvolatile memory cell of claim 17, wherein the asymmetric energy barriers include:
- a hole energy barrier from the floating charge-storage region to the substrate and a hole energy barrier from the floating charge-storage region to the control gate that are adapted to retain holes transported from the control gate during the first programming operation as the programmed charge in the floating charge-storage region; and
- an electron energy barrier from the substrate to the floating charge-storage region and an electron energy barrier from the control gate to the floating charge-storage region that are adapted to restrict electron emissions from the substrate and from the control gate into the floating charge-storage region to a negligible amount of electrons.

20. The nonvolatile memory cell of claim 16, wherein the floating charge-storage region includes a silicon floating gate.

21. The nonvolatile memory cell of claim 16, wherein the floating charge-storage region includes a charge-trapping floating plate.

22. The nonvolatile memory cell of claim 16, wherein the first insulator region includes a Silicon Dioxide ($SiO_2$) layer in contact with the channel region and a Tantalum Oxide ($Ta_2O_5$) layer disposed between the $SiO_2$ layer and the floating charge-storage region.

23. The nonvolatile memory cell of claim 16, wherein the second insulator region includes a Zirconium Oxide ($\Delta ZrO_2$) layer.

24. The nonvolatile memory cell of claim 16, further comprising an Oxide-Nitride-Oxide (ONO) gate stack sidewall.

25. A nonvolatile memory cell, comprising:
- a p− substrate;
- a first n type source/drain region and a second n type source/drain region separated by a channel region in the substrate;
- a Silicon Dioxide ($SiO_2$) layer in contact with the channel region;
- a Tantalum Oxide ($Ta_2O_5$) layer in contact with the $SiO_2$ layer;
- a charge-storage region in contact with the $Ta_2O_5$ layer;
- a Zirconium Oxide ($ZrO_2$) layer in contact with the charge-storage layer; and
- an Aluminum control gate in contact with the $ZrO_2$ layer.

26. The nonvolatile memory cell of claim 25, wherein the $SiO_2$ layer includes approximately 2 nm of $NH_3$ treated $SiO_2$.

27. The nonvolatile memory cell of claim 25, wherein the $SiO_2$ layer includes approximately 2 nm of NO treated $SiO_2$.

28. The nonvolatile memory cell of claim 25, wherein the $Ta_2O_5$ layer includes approximately 3–5 nm $t_{ox.eq.}$ of $Ta_2O_5$.

29. The nonvolatile memory cell of claim 25, wherein the $ZrO_2$ layer includes approximately 3–5 nm $t_{ox.eq.}$ of $ZrO_2$.

30. The nonvolatile memory cell of claim 25, wherein the first n type source/drain region and the second n type source/drain region both include an n− diffusion region and an n+ diffusion region.

31. The nonvolatile memory cell of claim 25, wherein:
- the $SiO_2$ layer includes approximately 2 nm of $SiO_2$;
- the $Ta_2O_5$ layer includes approximately 3–5 nm $t_{ox.eq.}$ of $Ta_2O_5$; and
- the $ZrO_2$ layer includes approximately 3–5 nm $t_{ox.eq.}$ of $ZrO_2$.

32. The nonvolatile memory cell of claim 25, wherein the floating charge-storage region includes a silicon floating gate.

33. The nonvolatile memory cell of claim 25, wherein the floating charge-storage region includes a charge-trapping floating plate.

34. A nonvolatile memory cell, comprising:
- a first source/drain region and a second source/drain region separated by a channel region in a substrate;
- a control gate of predetermined metallurgy;
- a gate stack separating the control gate from the channel region, the gate stack including:
  - a first insulator region including a Silicon Dioxide ($SiO_2$) layer and a Tantalum Oxide ($Ta_2O_5$) layer;
  - a floating plate separated from the channel region by the first insulator region, the floating plate including silicon nano crystals; and
  - a second insulator region including a Zirconium Oxide ($ZrO_2$) layer, wherein the control gate is separated from the floating charge-storage region by the second insulator region;
- wherein the gate stack includes selected material for providing desired asymmetric energy barriers in conjunction with the predetermined metallurgy of the control gate, and wherein the desired asymmetric energy barriers are adapted to:
primarily restrict carrier flow during programming to a selected carrier between the control gate and the floating charge-storing region, and
retain a programmed charge in the floating charge-storage region.

35. The nonvolatile memory cell of claim 34, wherein the floating plate includes Silicon-Rich-Oxide (SRO).

36. The nonvolatile memory cell of claim 35, wherein the SRO has a refractive index of approximately 1.6.

37. The nonvolatile memory cell of claim 34, wherein the floating plate includes Silicon Rich-Nitride (SRN).

38. The nonvolatile memory cell of claim 37, wherein the SRN has a refractive index of approximately 2.2.

39. The nonvolatile memory cell of claim 34, wherein the second insulator region includes a Zirconium Oxide ($ZrO_2$) layer, further comprising an injector SRN layer disposed between the control gate and the $ZrO_2$ layer.

40. The nonvolatile memory cell of claim 34, wherein the first insulator region includes a silicon dioxide ($SiO_2$) layer in contact with the channel region and a Tantalum Oxide ($Ta_2O_5$) layer disposed between the $SiO_2$ layer and the floating plate, further comprising an injector SRN layer disposed between the $SiO_2$ layer and the $Ta_2O_5$ layer.

41. The nonvolatile memory cell of claim 34, wherein:
the first insulator region includes a silicon dioxide ($SiO_2$) layer in contact with the channel region and a Tantalum Oxide ($Ta_2O_5$) layer disposed between the $SiO_2$ layer and the floating plate;
the second insulator region includes a Zirconium Oxide ($ZrO_2$) layer; and
the memory further comprises an injector SRN layer disposed between the $SiO_2$ layer and the $Ta_2O_5$ layer and an injector SRN layer disposed between the control gate and the $ZrO_2$ layer.

42. A nonvolatile memory cell, comprising:
a first source/drain region and a second source/drain region separated by a channel region in a substrate;
a control gate; and
a gate stack separating the control gate from the channel region, the gate stack including:
a first insulator region;
a floating charge-storage region separated from the channel region by the first insulator region; and
a second insulator region, wherein the control gate is separated from the floating charge-storage region by the second insulator region,
wherein a hole energy barrier from the control gate to the second insulator region is sufficiently small such that a primary programming charge transport includes hole transport from the control gate to the floating charge-storage region upon application of a programming electromotive force (EMF) at the control gate that is positive with respect to the substrate.

43. The nonvolatile memory cell of claim 42, wherein the hole energy barrier from the control gate to the second insulator region is approximately 1.9 ev.

44. The nonvolatile memory cell of claim 42, wherein an electron energy barrier from the substrate to the first insulator region is such that electron transport from the substrate to the floating charge-storage region is discouraged when applying the programming EMF at the control gate that is positive with respect to the substrate.

45. The nonvolatile memory cell of claim 44, wherein the electron energy barrier from the substrate to the first insulator region is approximately 3.2 ev.

46. The nonvolatile memory cell of claim 42, wherein an electron energy barrier from the floating charge-storage region to the second insulator region is such that a complimentary charge transport that further enhances programming speed includes electron transport from the floating charge-storage region to the control gate upon application of the programming EMF at the control gate that is positive with respect to the substrate.

47. The nonvolatile memory cell of claim 46, wherein the electron energy barrier from the floating charge-storage region to the second insulator region is approximately 1.5 ev.

48. The nonvolatile memory cell of claim 42, wherein an electron energy barrier from the floating charge-storage region to the first insulator region is such that electron transport from the floating charge-storage region to the substrate is small if an EMF transient is present at the substrate that is positive with respect to the floating charge-storage region.

49. The nonvolatile memory cell of claim 48, wherein the electron energy barrier from the floating charge-storage region to the first insulator region is a composite electron energy barrier of approximately 3.2 ev.

50. The nonvolatile memory cell of claim 42, wherein:
a hole energy barrier from the floating charge-storage region to the first insulator region and a hole energy barrier from the floating charge-storage region to the second insulator region is such that, upon removing the programming EMF, hole emission from the floating charge-storage region is negligible; and
an electron energy barrier from the substrate to the first insulator region and an electron energy barrier from the control gate to the second insulator region is such that, upon removing the programming EMF, electron emission from the floating charge-storage region to the control gate and to the substrate is negligible.

51. The nonvolatile memory cell of claim 50, wherein:
the hole energy barrier from the floating charge-storage region to the first insulator region is approximately 2.9 ev with an additional energy barrier of approximately 1.8 ev for a composite energy barrier of approximately 4.7 ev;
the hole energy barrier from the floating charge-storage region to the second insulator region is approximately 3.1 ev;
the electron energy barrier from the substrate to the first insulator region is approximately 3.2 ev; and
the electron energy barrier from the control gate to the second insulator region is approximately 3.8 ev.

52. The nonvolatile memory cell of claim 42, wherein the programming electromotive force (EMF) at the control gate that is positive with respect to the substrate is approximately 12 V.

53. The nonvolatile memory cell of claim 42, wherein:
the floating charge-storage region includes a floating plate with silicon nano crystals; and
the programming electromotive force (EMF) at the control gate that is positive with respect to the substrate is approximately 9 V.

54. A nonvolatile memory cell, comprising:
a first source/drain region and a second source/drain region separated by a channel region in a substrate;
a control gate; and a gate stack separating the control gate from the channel region, the gate stack including:
a first insulator region;
a floating charge-storage region separated from the channel region by the first insulator region; and
a second insulator region, wherein the control gate is separated from the floating charge-storage region by the second insulator region,
wherein a hole energy barrier from the floating charge-storage region to the second insulator region and the equivalent oxide thicknesses of the second insulator region and the first insulator region are such that hole transport from the floating charge-storage region to the control gate is encouraged if an EMF transient is present at the substrate that is positive with respect to the control gate.

55. The nonvolatile memory cell of claim 54, wherein the hole energy barrier from the floating charge-storage region to the second insulator region is approximately 3.1 ev.

56. The nonvolatile memory cell of claim 54, wherein an electron energy barrier from the control gate to the second insulator region is such that a complimentary charge transport to further enhance programming speed includes electron transport from the control gate to the floating charge-storage region if an EMF transient is present at the substrate that is positive with respect to the control gate.

57. The nonvolatile memory cell of claim 56, wherein the electron energy barrier from the control gate to the second insulator region is approximately 3.8 ev.

58. The nonvolatile memory cell of claim 54, wherein a hole energy barrier from the substrate to the first insulator region is such that hole transport from the substrate is negligible if a programming EMF is present at the substrate that is positive with respect to the control gate.

59. The nonvolatile memory cell of claim 58, wherein the hole energy barrier from the substrate to the first insulator region is approximately 4.7 ev.

60. The nonvolatile memory cell of claim 54, wherein an electron energy barrier from the floating charge region to the first insulator region is such that an effective electron transport from the floating charge-storage region to the substrate through field emission is small if a programming EMF is present at the substrate that is positive with respect to the control gate.

61. The nonvolatile memory cell of claim 60, wherein the electron energy barrier from the floating charge-storing region to the first insulator region is a composite electron energy barrier of approximately 3.2 ev.

62. The nonvolatile memory cell of claim 54, wherein the programming EMF is present at the substrate that is positive with respect to the control gate by approximately +12 V.

63. The nonvolatile memory cell of claim 54, wherein:
the floating charge-storage region includes a floating plate with silicon nano crystals; and
the programming EMF is present at the substrate that is positive with respect to the control gate is approximately +9 V.

64. A nonvolatile memory cell, comprising:
a first source/drain region and a second source/drain region separated by a channel region in a substrate;
a control gate; and
a gate stack separating the control gate from the channel region, the gate stack including:
a first insulator region having a first equivalent oxide thickness;
a floating charge-storage region separated from the channel region by the first insulator region; and
a second insulator region having a second equivalent oxide thickness, wherein the control gate is separated from the floating charge-storage region by the second insulator region,
wherein the equivalent oxide thickness of the first insulator region and the equivalent oxide thickness of the second insulator region is such that an electric field across the second insulator region is enhanced when a programming potential is applied across the control gate and the substrate,
wherein the first insulator region and the second insulator region include materials that provide desired asymmetric energy barriers, and
wherein the desired asymmetric energy barriers are adapted to:
primarily restrict carrier flow during programming to a selected carrier between the control gate and the floating charge-storage region, and
retain a programmed charge in the floating charge-storage region.

65. The nonvolatile memory cell of claim 64, wherein the selected carrier between the control gate and the floating charge-storage gate includes holes.

66. The nonvolatile memory cell of claim 64, wherein:
the substrate includes p– silicon;
the first insulator region includes a Silicon Dioxide ($SiO_2$) layer in contact with the channel region and a Tantalum Oxide ($Ta_2O_5$) layer in contact with the $SiO_2$ layer and with the charge-storage region;
the second oxide includes a Zirconium Oxide ($ZrO_2$) layer in contact with the charge-storage layer; and
the control gate includes aluminum.

67. The nonvolatile memory cell of claim 66, wherein:
the $SiO_2$ layer includes approximately 2 nm of $SiO_2$;
the $Ta_2O_5$ layer includes approximately 3–5 nm $t_{ox.eq.}$ of $Ta_2O_5$; and
the $ZrO_2$ layer includes approximately 3–5 nm $t_{ox.eq.}$ of $ZrO_2$.

68. A flash memory array, comprising:
a number of nonvolatile memory cells, wherein each nonvolatile memory cell includes:
a p– substrate;
a first n type source/drain region and a second n type source/drain region separated by a channel region in the substrate;
a Silicon Dioxide ($SiO_2$) layer in contact with the channel region;
a Tantalum Oxide ($Ta_2O_5$) layer in contact with the $SiO_2$ layer;
a charge-storage region in contact with the $Ta_2O_5$ layer;
a Zirconium Oxide ($ZrO_2$) layer in contact with the charge-storage layer; and
an Aluminum control gate in contact with the $ZrO_2$ layer;
a number of source lines, each of the source lines being coupled to the first source/drain region of at least one of the memory cells;
a number of control gate lines, each of the gate lines being coupled to the control gate of at least one of the memory cells; and
a number of bit lines, each of the bit lines being coupled to the second source/drain region of at least one of the memory cells.

69. The flash memory array of claim 68, wherein the $SiO_2$ layer includes approximately 2 nm of $NH_3$ treated $SiO_2$.

70. The flash memory array of claim 68, wherein the $SiO_2$ layer includes approximately 2 nm of NO treated $SiO_2$.

71. The flash memory array of claim 68, wherein the $Ta_2O_5$ layer includes approximately 3–5 nm $t_{ox.eq.}$ of $Ta_2O_5$.

72. The flash memory array of claim 68, wherein the $ZrO_2$ layer includes approximately 3–5 nm $t_{ox.eq.}$ of $ZrO_2$.

73. The flash memory array of claim 68, wherein the first n type source/drain region and the second n type source/drain region both include an n– diffusion region and an n+ diffusion region.

74. The flash memory array of claim 68, wherein:
the $SiO_2$ layer includes approximately 2 nm of $SiO_2$;
the $Ta_2O_5$ layer includes approximately 3–5 nm $t_{ox.eq.}$ of $Ta_2O_5$; and
the $ZrO_2$ layer includes approximately 3–5 nm $t_{ox.eq.}$ of $ZrO_2$.

75. The flash memory array of claim 68, wherein the floating charge-storage region includes a silicon floating gate.

76. The flash memory array of claim 68, wherein the floating charge-storage region includes a charge-trapping floating plate.

77. An electronic system, comprising:
a processor; and
a memory device adapted to communicate with the processor, wherein the memory device includes an array of flash memory cells, comprising:
a number of nonvolatile memory cells, wherein each nonvolatile memory cell includes:
a p– substrate;
a first n type source/drain region and a second n type source/drain region separated by a channel region in the substrate;
a Silicon Dioxide ($SiO_2$) layer in contact with the channel region;
a Tantalum Oxide ($Ta_2O_5$) layer in contact with the $SiO_2$ layer;
a charge-storage region in contact with the $Ta_2O_5$ layer;
a Zirconium Oxide ($ZrO_2$) layer in contact with the charge-storage layer; and
an Aluminum control gate in contact with the $ZrO_2$ layer;
a number of source lines, each of the source lines being coupled to the first source/drain region of at least one of the memory cells;
a number of control gate lines, each of the gate lines being coupled to the control gate of at least one of the memory cells; and
a number of bit lines, each of the bit lines being coupled to the second source/drain region of at least one of the memory cells.

78. The electronic system of claim 77, wherein:
the $SiO_2$ layer includes approximately 2 nm of $SiO_2$;
the $Ta_2O_5$ layer includes approximately 3–5 nm $t_{ox.eq.}$ of $Ta_2O_5$; and
the $ZrO_2$ layer includes approximately 3–5 nm $t_{ox.eq.}$ of $ZrO_2$.

79. A method of forming a floating gate transistor, comprising:
forming a first source/drain region and a second source/drain region separated by a channel region in a p– substrate;
forming a gate stack over the channel region, including:
forming an $SiO_2$ layer on the channel region;
forming a $Ta_2O_5$ layer on the $SiO_2$ layer;
forming a floating charge-storage region on the $Ta_2O_5$ layer; and
forming a $ZrO_2$ layer on the floating charge-storage region; and
forming an aluminum control gate on the $Ta_2O_5$ layer.

80. The method of forming a floating gate transistor of claim 79, wherein forming an $SiO_2$ layer on the channel region includes forming an approximately 2 nm thick layer of $SiO_2$.

81. The method of forming a floating gate transistor of claim 79, wherein forming a $Ta_2O_5$ layer on the $SiO_2$ layer includes forming a layer of $Ta_2O_5$ that has an equivalent oxide thickness of approximately 3 to 5 nm.

82. The method of forming a floating gate transistor of claim 79, wherein forming a floating charge-storage region on the $Ta_2O_5$ layer includes forming a silicon floating gate.

83. The method of forming a floating gate transistor of claim 79, wherein forming a floating charge-storage region on the $Ta_2O_5$ layer includes forming a floating plate with silicon nano crystals.

84. The method of forming a floating gate transistor of claim 79, wherein forming a $ZrO_2$ layer on the floating charge-storage region includes forming a layer of $ZrO_2$ that has an equivalent oxide thickness of approximately 3 to 5 nm.

* * * * *

UNITED STATES PATENT AND TRADEMARK OFFICE
CERTIFICATE OF CORRECTION

PATENT NO. : 6,784,480 B2
DATED : August 31, 2004
INVENTOR(S) : Bhattacharyya

It is certified that error appears in the above-identified patent and that said Letters Patent is hereby corrected as shown below:

Title page,
Item [56], References Cited, OTHER PUBLICATIONS,
"Arya, S., et al." reference, delete "9/1" and insert -- 91 --, therefor;
"Grenier, J." reference, delete "Grenier" and insert -- Greiner --, therefor.
"Grenier, J." reference, (second occurrence) delete "Grenier" and insert -- Greiner --, therefor.
"Yamaguchi, Takeshi" reference, delete "Device" and insert -- Devices --, therefor.

Column 7,
Line 34, after "3-5 nm" insert -- $t_{ox.eq.}$ --.

Column 9,
Line 13, delete "prograniming" and insert -- programming --, therefor.

Column 11,
Line 16, delete "floatin" and insert -- floating --, therefor.

Signed and Sealed this

Tenth Day of May, 2005

JON W. DUDAS
*Director of the United States Patent and Trademark Office*